United States Patent
Ono

(10) Patent No.: US 7,211,835 B2
(45) Date of Patent: May 1, 2007

(54) LIGHT EMITTING DEVICE, METHOD OF MANUFACTURING THE SAME AND LIGHTING EQUIPMENT

(75) Inventor: Masato Ono, Sagamihara (JP)

(73) Assignee: Nichia Corporation, Tokushima (JP)

( * ) Notice: Subject to any disclaimer, the term of this patent is extended or adjusted under 35 U.S.C. 154(b) by 22 days.

(21) Appl. No.: 10/887,060

(22) Filed: Jul. 8, 2004

(65) Prior Publication Data
US 2005/0007783 A1    Jan. 13, 2005

(30) Foreign Application Priority Data
Jul. 9, 2003    (JP)    ............................. 2003-272307
Oct. 17, 2003    (JP)    ............................. 2003-357944

(51) Int. Cl.
*H01L 29/22* (2006.01)
(52) U.S. Cl. ....................................................... 257/99
(58) Field of Classification Search ................ 257/99
See application file for complete search history.

(56) References Cited

U.S. PATENT DOCUMENTS

| 5,530,269 | A | * | 6/1996 | Tang ............................ 257/88 |
| 5,742,007 | A |   | 4/1998 | Kornowski et al. |
| 6,051,652 | A |   | 4/2000 | Kawate et al. |
| 2002/0175621 | A1 |  | 11/2002 | Song et al. |
| 2004/0065894 | A1 | * | 4/2004 | Hashimoto et al. ......... 257/100 |
| 2004/0164310 | A1 | * | 8/2004 | Uemura ....................... 257/99 |
| 2003/0098651 | A1 |  | 11/2004 | Lin et al. |
| 2004/0222433 | A1 | * | 11/2004 | Mazzochette et al. ........ 257/99 |
| 2005/0269587 | A1 | * | 12/2005 | Loh et al. ..................... 257/99 |
| 2005/0285505 | A1 | * | 12/2005 | Jeganathan et al. ......... 313/500 |

FOREIGN PATENT DOCUMENTS

| JP |    57096074  | 6/1982 |
| JP | 2000 353828 | 12/2000 |

OTHER PUBLICATIONS

Patent Abstracts of Japan; vol. 2000, No. 15 (Stanley Electric Col Ltd) 2000 (1 page).
Patent Abstracts of Japan, vol. 6, No. 180 (Asahi Chem Ind Co Ltd) 1982 (1 page).
European Search Report issued in Application No. EP 04103259 dated Sep. 5, 2006(2 pages).

* cited by examiner

*Primary Examiner*—Evan Pert
*Assistant Examiner*—Krista Soderholm
(74) *Attorney, Agent, or Firm*—Osha Liang LLP

(57) ABSTRACT

In a light emitting device with a heat-release metallic part made of metal and a packaging ceramic part made of ceramics bonded to the metallic part via an adhesive, the adhesive is a hot melt that melts with heat at a melting temperature higher than a given temperature and has flexibility when it has been hardened and formed a bond, and the ceramic part has pores at least in a given bonding surface region so that the hot melt is impregnated into the pores.

32 Claims, 15 Drawing Sheets

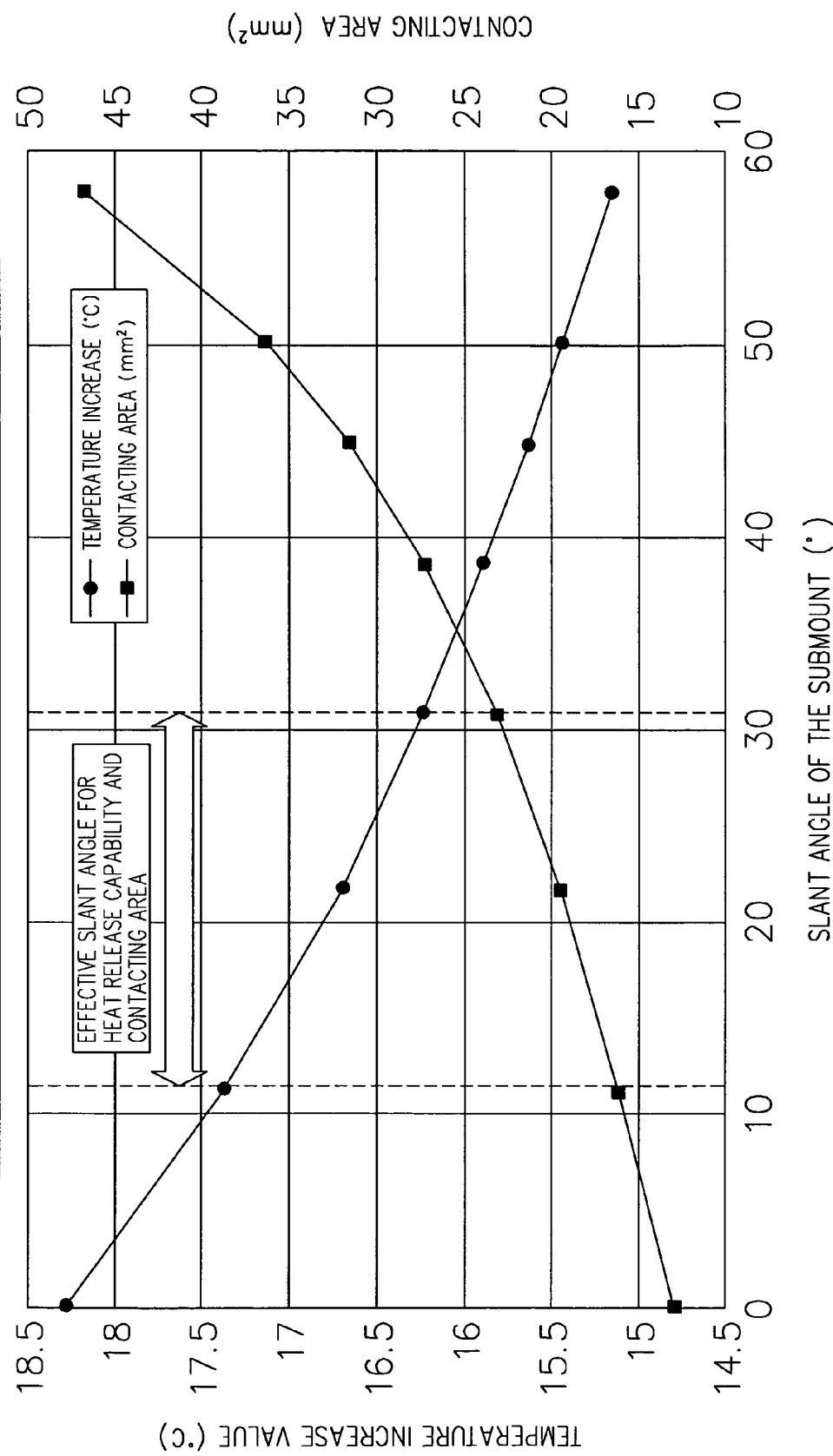

LIGHT EMITTING DEVICE, METHOD OF MANUFACTURING THE SAME AND LIGHTING EQUIPMENT

CROSS REFERENCE TO RELATED APPLICATION

This application claims priority from Japanese Patent Application Nos. 2003-272307 and 2003-357944, which are incorporated herein by reference.

BACKGROUND OF THE INVENTION

1. Field of the Invention

The present invention relates to a light emitting device such as a light emitting diode and a laser diode that has an excellent heat release capability, a method of manufacturing the light emitting device, and a lighting equipment using the same, in which the light emitting device is for example in the form of a light emitting diode provided with a high-electric power and high-optical power light emitting element.

2. Related Art

As an typical example of the light emitting device, it can be cited an electronic device such as a light emitting diode and a laser diode. Of them, the light emitting diode (hereinafter referred to an LED) is provided with a light emitting element that is powered so as to emit light. At the time of light emission, the light emitting element also generates heat, causing temperature rise of the LED.

An LED is recently used as a display device for an indicator of an electric appliance, a liquid crystal backlight of a mobile phone thanks to the development of a blue LED, a white LED and the like. Also, an LED is expected to be widely used for a lighting equipment such as an interior illumination, automobile lighting or traffic signal because of its high light emission efficiency and improved brightness. Thus, a demand for a high optical power LED is increased so as to make an LED applicable to such a lighting equipment. The application of the LED in a new field is accompanied with a problem to cause temperature rise of an LED due to increased power supply.

For the light emitting device such as a high electric power and high optical power LED as mentioned above, a ceramic material is sometimes used for a package part that is tolerable against such temperature rise.

A light emitting device with such a packaging ceramic part is provided with for example a metallic part made of metal for heat radiation that is mounted to the ceramic part, allowing heat from a semiconductor element such as a light emitting element to be instantly transferred to the metallic part by heat conduction and to be dispersed through the metallic part for heat release with high efficiency from the surface of the metallic part to a heat release section or part, thus preventing the semiconductor element from being heated over a given performance guarantee temperature.

For producing the light emitting device with the heat-release metallic part and the packaging ceramic part, both parts are generally bonded together via an adhesive. The bonding of these parts is conventionally made by a brazing technique using a brazing material such as silver (Ag), gold (Au), copper (Cu), zinc (Zn) or cadmium (Cd), which is generally used as the adhesive for this purpose.

The light emitting device with the heat-release metallic part bonded to the packaging ceramic part by brazing may cause stress in these parts as the temperature rises, due to difference in coefficient of linear expansion therebetween, resulting in the likelihood of causing warping of these parts or break (crack) of the ceramic part. Hitherto, in order to avoid this problem, it is selected materials used for these ceramic part and metallic part to have approximate coefficients of linear expansion for bonding.

As the ceramic material, generally used are such as aluminum nitride (AlN) and aluminum oxide ($Al_2O_3$). As the metallic material, generally used are such as copper-tungsten composite (CuW), and copper-molybdenum composite (CuMo, CuMoCu). The followings are the coefficient of linear expansion of each material.

| Ceramic Material | AlN | $4.5 \times 10^{-6}$ |
| --- | --- | --- |
| | $Al_2O_3$ | $6.7 \times 10^{-6}$ |
| Metallic Material | CuW | $6.5 \times 10^{-6}$ (W-10:89W, 11Cu) |
| | CuMo | $7.0 \times 10^{-6}$ (CM-15:85Mo, 15Cu) |
| | CuMoCu | $8.9 \times 10^{-6}$ (CMC111) | wherein CuMoCu (CMC111) is made up of two Cu plates and an Mo plate held therebetween and bonded together with the layer ratio of Cu:Mo:Cu=1:1:1.

The metallic materials as described above, such as CuW, CuMo and CuMoCu respectively have thermal conductivities (specifically, CuW: 180 W/mk, CuMo: 160 W/mk, and CuMoCu: 232 W/mk), which are lower than other metallic materials having a relatively high thermal conductivity (typically, Cu: 393 W/mk). Therefore, while there is a demand for using a metallic material such as Cu having a relatively high thermal conductivity for a heat-release metallic part in a recent high-electric power and high-optical power light emitting device such as an LED used in a lighting equipment, a metallic material such as Cu, a coefficient of linear expansion of which is $17.0 \times 10^{-6}$, is greatly different in coefficient of linear expansion from the ceramic material, which results in the likelihood of causing warping or break (crack) of the ceramic part due to stress caused as the temperature rises.

On the other hand, a high-electric power and high-optical power LED is required to meet the following demand. That is, in an LED, light emitted from the side (not main sides) of a light emitting element is hard to be utilized and therefore light is hard to be emitted with high efficiency. For example, where a ceramic part is used as a packaging part, light emitted from the side of the light emitting element is reflected on the ceramic part and then radiated to the outside, and this reflection leads to deteriorated efficiency in utilization of light. Where an LED is utilized in a lighting equipment or the like with a corrective lens or the like for correction of light, light emitted from the side of the light emitting element and then reflected on the ceramic part invites occurrence of inconsistent light correction. Conventionally, plural LEDs are provided to constitute plural light sources, thereby limiting the influence of this inconsistent light correction as much as possible. However, a recent high-electric power and high-optical power LED can be utilized as a single light source. Accordingly, a recent high-electric power and high-optical power LED is required to achieve effective and efficient utilization of light emitted from the side of the light emitting element while limiting inconsistent light correction.

In the conventional lighting equipment utilizing a light emitting device such as an LED, electrical connection and fixation with the light emitting device is made by soldering, or calking of a lead frame or the like. Accordingly, the lighting equipment utilizing the light emitting device, in which heat release to an external wiring substrate is made via a soldered portion or lead frame, achieves only a limited transfer of heat and hence insufficient heat release capability. Therefore, it is not possible to make a large electric current flow through the lighting equipment, thus making it impossible to achieve a high brightness lighting equipment.

Also, once a light emitting device is incorporated into the lighting equipment by soldering or calking with an external wiring substrate, it is difficult to remove only the light emitting device from the lighting equipment and repair the same.

Another disadvantage associated with the conventional lighting equipment, in which a conductive pattern provided on a main side of the light emitting device is partially soldered or calked with an external wiring substrate, is that the light emitting device is likely to be easily subjected to an adverse influence due to mechanical vibrations coming from the outside. That is, the calking of the conductive pattern of the light emitting device may easily cause variation in optical characteristics due to unintentional rolling or movement of the light emitting device in the lighting equipment, and the soldering of the light emitting device may easily cause defect in electrical connection with an external electrical circuit substrate.

It is a first object of the present invention to provide a light emitting device with a heat-release metallic part made of metal and a packaging ceramic part made of ceramics, which are bonded together with an adhesive, and a method of manufacturing the same, which are capable of preventing a problem due to the difference in coefficient of linear expansion between the metallic part and the ceramic part, such as a problem of causing stress as the temperature of the metallic part and the ceramic part rises, which leads to warping or break (crack) of the ceramic part, and therefore allowing a metallic material having a good thermal conductivity to be used, thus achieving a high-electric power and high-optical power device characteristic never achieved before.

It is a second object of the present invention to provide a light emitting device with a heat-release metallic part made of metal and a packaging ceramic part made of ceramics, which are bonded together with an adhesive, which is capable of achieving effective and efficient utilization of light emitted from the side of the light emitting element while limiting inconsistent light correction, where the light emitting device is provided in the form of an LED with a light emitting element.

It is a third object of the present invention to provide a highly reliable lighting equipment thanks to improved heat release capability, allowing it to be used in place of a conventional lighting equipment such as a lamp and fluorescent lamp.

SUMMARY OF THE INVENTION

The present inventors have made intensive studies in order to achieve the first object of the present invention and found out the following matters. That is, in a light emitting device with the heat release metallic part made of metal bonded to the packaging ceramic part by an adhesive by soldering using a brazing material as an adhesive, this brazing material cannot provide an ample buffering action against stress caused as the temperature of the metallic part and the ceramic part rises, and hence it is easy to cause a problem of warping, or break (crack) of the ceramic part due to the difference in coefficient of linear expansion between the metallic part and the ceramic part. In order to address this problem, it is employed as the adhesive a hot melt of the type allowing itself to have flexibility when it has been hardened and formed a bond. This hot melt adhesive can absorb stress caused by the temperature rise of the metallic part and the ceramic part, thereby limiting occurrence of warping of these parts or break (crack) of the ceramic part due to the difference in coefficient of linear expansion between the metallic part and the ceramic part.

The present inventors further have known in the course of the study that desirable effects can be produced by utilizing ceramic materials having a porous structure that are provided in light of fragility and workability. That is, when the hot melt is coated on a porous ceramic material, it is impregnated into pores of the ceramic material and held in these pores. This results in improved bonding force of the hot melt to the ceramic material. Whereby, it is possible to maintain a good bonding capability even with a relatively thin a hot melt when it has been hardened and formed a bond, and correspondingly improves the thermal conductivity of the hot melt.

The present invention has been conceived based on the above knowledge. Accordingly, in order to achieve the first object of the present invention, there is provided a light emitting device and a method of manufacturing the same, the detail of which will be discussed below.

(1) Light Emitting Device

In a light emitting device with a heat-release metallic part made of metal and a packaging ceramic part made of ceramics bonded to the metallic part via an adhesive, the adhesive is a hot melt that melts with heat at a melting temperature higher than a given temperature and has flexibility when it has been hardened and formed a bond, and the ceramic part has pores at least in a given bonding surface region so that the hot melt is impregnated into the pores.

(2) Method of Manufacturing a Light Emitting Device

In a method of manufacturing a light emitting device with a heat-release metallic part made of metal and a packaging ceramic part made of ceramics bonded to the metallic part via an adhesive, the method includes an adhesive preparation process, an adhesive coating and impregnating process and a ceramics-metal bonding process. The adhesive preparation process includes preparing a hot melt as the adhesive by dissolving a resin material that is soluble in water or water soluble organic solvent, melts with heat at a melting temperature higher than a given temperature and has flexibility when it has been hardened and formed a bond, into the water or water soluble organic solvent. The adhesive coating and impregnating process includes employing as a material of the ceramic part a porous ceramic material having pores at least in a given bonding surface region thereof, coating the hot melt prepared in the adhesive preparation process on the given bonding surface region of the ceramic part, and impregnating the hot melt in the ceramic part through the pores in the given bonding surface region of the ceramic part under a given vacuum pressure. The ceramics-metal bonding process includes bringing the hot melt impregnated in the ceramic part into a molten state between the ceramic part and the metallic part at a temperature equal to or higher than the melting temperature, thereby bonding the ceramic part to the metallic part.

With the light emitting device of the present invention, in which the adhesive for bonding the metallic part to the ceramic part is a hot melt that has flexibility when it has been hardened and formed a bond, this hot melt can absorb stress caused as the temperature of the metallic part and the ceramic part rises, thereby preventing a problem, such as warping of either or both of these parts or break (crack) of the ceramic part by the temperature rise, due to the difference in coefficient of linear expansion between the metallic part and the ceramic part. As a result, it is possible to use a metallic material (typically copper (Cu)) having a better thermal conductivity as a material of the metallic part and hence achieve a high-electric power and high-optical power device characteristic never achieved before. Also, the hot melt, which is impregnated into pores in the bonding surface region of the ceramic part so as to be held with the ceramic material via pores, can achieve improved bonding force to the ceramic part. Whereby, it is possible to maintain a good bonding capability even by thinning the hot melt when it is hardened and forms a bond, and correspondingly improve the thermal conductivity of the hot melt.

According to the method of manufacturing the light emitting device, the hot melt prepared as the adhesive is coated on the bonding surface region of the ceramic part and impregnated into the pores of this region of the ceramic part under the given vacuum pressure. Since this hot melt is made of a resin material dissolved into the water or water soluble organic solvent, it is less sticky at room temperature (e.g., 25° C.) so that the hot melt can be evenly impregnated into the pores. The vacuum pressure applied may be set to about 1 kPa or lower. Then, the hot melt, which has been coated and impregnated, is activated by the application of heat under a bonding temperature equal to or higher than the melting temperature, allowing itself to be brought into a molten state, thereby bonding the ceramic part to the metallic part. The hot melt, which has been impregnated into pores of the bonding surface region of the ceramic part under vacuum, can provide a better bonding strength with the pores. Thus, it is possible to manufacture the light emitting device of the present invention.

According to the method of manufacturing the light emitting device of the present invention, it is possible to prevent a problem, such as warping of either or both of the metallic part and the ceramic part or break (crack) of the ceramic part at the time of the temperature change, due to the difference in coefficient of linear expansion between the metallic part and the ceramic part. As a result, it is possible to use a metallic material having a relatively high thermal conductivity as a material of the metallic part and hence achieve a high-electric power and high-optical power device characteristic never achieved before. Also, the impregnation of the hot melt into the pores of the bonding surface region of the ceramic part can provide a better bonding strength of the hot melt with the ceramic part via the pores. Accordingly, it is possible to improve the bonding strength between the ceramic part and hence maintain a good bonding capability even with a relatively thin hot melt when it has been hardened and formed a bond, thereby providing a light emitting device that can correspondingly improve the thermal conductivity of the hot melt.

As materials of the metallic part, it can be cited those having a relatively high thermal conductivity such as gold (Au) and silver (Ag) in addition to Cu as mentioned above. Particularly, Cu is suitable because it has an excellent thermal conductivity, is less expensive, and has an excellent workability as compared with composite materials such as CuW, CuMo and CuMoCu.

While a material of the ceramic part is not necessarily limited to a specific one, aluminum nitride (AlN) and aluminum oxide ($Al_2O_3$) can be cited as examples of the material. The ceramic part may be made up of plural ceramic pieces. In such a case, the ceramic pieces may be bonded together with the hot melt. As a preferable material of the ceramic part, a porous ceramic material that has pores distributed throughout the material including the surface region can be cited in view of fragility and workability. The porosity of the ceramic part may be in the range of about 5% to 20%. When the porosity is less than about 5%, the impregnation of the hot melt into the pores is hard to be made. When the porosity is more than about 20%, the thermal conductivity is easy to be lowered. While the diameter or size of each pore in the ceramic part is not limited to a specific one, but it can be in the range of about 0.01 mm–0.15 mm. In the adhesive coating and impregnating process in the method of manufacturing the light emitting device of the present invention, since the resin material has been dissolved into the water or water soluble organic solvent, it can be evenly impregnated into such minute pores having a diameter or size of about 0.01 mm–0.15 mm.

The porosity herein mentioned is designated as an apparent porosity according to JIS R1634 (Method of measuring the sintered compact density and apparent porosity, of fine ceramics, Method of calculating the apparent porosity of ceramics) and is a value calculated by the calculation formula sepecified below:

$$Pb=((W3-W1)/(W3-W2))\times 100$$

wherein Pb: apparent porosity (%), [wherein W1: dry weight (g) (a weight value measured after drying by a constant temperature oven at 110±5° C. and then heat released in a desiccator), W2: in-water weight (g) (a value determined by measuring the weight of a water-saturated specimen suspended in water with wire, upon correction of the weight of a jig), W3: water saturated weight (g) (a value determined by retrieving a water-saturated specimen from water and removing droplet from the surface of the specimen with a moist gauze and measuring the weight of the specimen)], following the calculation method called as the Archimedean method.

The pore size is calculated by a mercury intrusion method which involves pressing mercury into fine pores of a specimen and calculating the pore volume based on the intrusion pressure and the volume of mercury intruded into the pore. Specifically, the pore size is calculated by using a mercury porosimeter (e.g., Autopore 9200 manufactured by Shimadzu Corporation).

As the resin material used in the method of manufacturing the light emitting device of the present invention, which melts at a melting temperature higher than the given temperature and has flexibility when it has been hardened and formed a bond, is not necessarily limited to a specific one, but it can be cited such as a resin composition containing thermoplastic elastomer, an ethylene-vinyl acetate copolymer and acrylic or methacrylic copolymer. In the light emitting device of the present invention, as the hot melt that melts at a melting temperature higher than the given temperature and has flexibility when it has been hardened and formed a bond, it can be cited a hot melt with modulus of elasticity in the order of $0.2\times 10^8$ Pa–$13.0\times 10^8$ Pa. In view of material selection capable of contributing to higher modulus of elasticity mentioned below, for the hot melt of the present invention, the modulus of elasticity in the order of $0.25\times 10^8$ Pa–$5.0\times 10^8$ Pa is more preferable and that in the order of $1.9\times 10^8$ Pa–$3.3\times 10^8$ Pa is most preferable. The hot melt having such a modulus of elasticity is apparently excellent in flexibility as compared with conventional brazing materials as shown below.

Modulus of Elasticity Pa

| | |
|---|---|
| Ag | $827.7 \times 10^8$ |
| Au | $780.6 \times 10^8$ |
| Cu | $1274.9 \times 10^8$ |
| Zn | $760.0 \times 10^8$ |
| Cd | $489.4 \times 10^8$ |

The thermoplastic elastomer is a material such as natural rubber and synthetic rubber, which has a molecular structure with highly cross-linked long molecular chains, and acts to absorb stress caused by the temperature rise of the metallic part and the ceramic part. As the thermoplastic elastomer, it can be cited a styrene, olefinic, polyester, polyvinyl chloride or polyamide thermoplastic elastomer. Of them, a styrene or olefinic thermoplastic elastomer is preferable since the modulus of elasticity of the hot melt containing it can substantially fall in the more preferable range of $0.25 \times 10^8$ Pa–$5.0 \times 10^8$ Pa.

The ethylene-vinyl acetate copolymer and acrylic or methacrylic copolymer act to improve the bonding strength between the metallic part and the ceramic part.

The resin material may contain polyethylene. As this polyethylene, a low-, or high-density polyethylene may be used. This acts to improve the wettability of the hot melt. The polyethylene-containing resin material is preferable in light of the wettability of the hot melt.

In a case where, of a thermoplastic elastomer, an ethylene-vinyl acetate copolymer, acrylic or methacrylic copolymer and polyethylene, the resin composition contains at least a thermoplastic elastomer, an ethylene-vinyl acetate copolymer, and acrylic or methacrylic copolymer, each of these components may be contained in a proportion in the range:

Thermoplastic elastomer: approx. 20 wt. %–80 wt. %

Ethylene-vinyl acetate copolymer, and acrylic or methacrylic copolymer: approx. 10 wt. %–60 wt. %

Polyethylene: 0 wt. %–40 wt. %

Of which, the ratio of at least the thermoplastic elastomer is properly adjusted, thereby allowing the modulus of elasticity of the hot melt that has been hardened and formed a bond to be adjusted. For example, the lesser the thermoplastic elastomer, the larger the modulus of elasticity. On the other hand, the more the thermoplastic elastomer, the smaller the modulus of elasticity.

The resin material may be mixed with a thermosetting resin having an excellent thermal resistance such as a polyimide resin, BT resin or silicone according to needs. This thermosetting resin may be contained in a proportion in the range of about 0.01 wt. %–10 wt. %. This thermosetting resin is impregnated into the pores of the bonding surface region of the ceramic part so as to maintain the bonding strength between the metallic part and the ceramic part even if they are heated to around the given temperature.

In a case where the resin material is dissolved into the water soluble organic solvent, this solvent is not limited to a specific one, but as a preferable solvent, it can be cited a mixed solvent comprising such as dimethyl ethyl ketone and dimethylformamide.

In the method of manufacturing the light emitting device of the present invention, the thickness of the hot melt coated on the ceramic part may be in the range of about 20 μm–200 μm. In the light emitting device of the present invention, the thickness of the hot melt when it has been hardened and formed a bond may be in the range of about 0.01 mm–0.10 mm. When this thickness is smaller than around 0.01 mm, the bonding capability of the hot melt is easy to be deteriorated. On the other hand, when this thickness is larger than 0.10 mm, the thermal conductivity of the hot melt is easy to be deteriorated. Also, in the method of manufacturing the light emitting device of the present invention, the adhesive coating and impregnating process may include an adhesive drying process for drying the ceramic part with the hot melt coated and impregnated thereinto.

The light emitting device of the present invention may be provided in the form of a light emitting diode with a light emitting element provided to the metallic part or the ceramic part. The method of manufacturing the light emitting device of the present invention may further include a process for providing a light emitting element to the metallic part or the ceramic part so as to manufacture the light emitting device in the form of a light emitting diode. The light emitting device in the form of the light emitting diode may have the metallic part made of a metallic material having a relatively high thermal conductivity such as Cu or other known material, so as to achieve a high-electric power and high-optical power light emitting diode never achieved before, which has a light emitting characteristic with a high brightness.

The light emitting device of the present invention (e.g., a light emitting device in the form of a light emitting diode) may further include a light transmitting part (e.g., an optical part made of glass, more specifically, a glass lens), in which the light transmitting part (e.g., the optical part) may be bonded to the ceramic part with the hot melt. In this case, the hot melt is comprised of a first hot melt for bonding between the metallic part and the ceramic part, and a second hot melt for bonding between the light transmitting part (e.g., the optical part) and the ceramic part. For example, in consideration of the fabrication process of the device, which involves bonding the metallic part to the ceramic part, then providing a semiconductor element (e.g., a light emitting element) thereto and then bonding the light transmitting part (e.g., the optical part) to the ceramic part, it is preferable to have the relationship between a melting temperature a of the first hot melt and a melting temperature b of the second hot melt: a>b. With this relationship, even if the light transmitting part (e.g., the optical part) is bonded to the ceramic part with the second hot melt after bonding the metallic part to the ceramic part with the first hot melt, it is possible to prevent melting of the first hot melt that bonds the metallic part to the ceramic part, when bonding the light transmitting part (e.g., the optical part) to the ceramic part with the second hot melt.

In the method of manufacturing the light emitting device (e.g., a light emitting device in the form of a light emitting diode), the light emitting device may further include a light transmitting part (e.g., an optical part made of glass, more specifically, a glass lens). Accordingly, the method may include a ceramics-light transmitting part bonding process, which involves bringing the hot melt impregnated in the ceramic part in the adhesive coating and impregnating process into a molten state between the ceramic part and the metallic part at a temperature equal to or higher than the melting temperature, thereby bonding the ceramic part to the light transmitting part (e.g., the optical part).

In the above case, for example, in consideration of the fabrication process, which involves bonding the light transmitting part (e.g., the optical part) to the ceramic part after bonding the metallic part to the ceramic part and providing the semiconductor element (e.g., the light emitting element) thereto, each of the adhesive preparation process, the adhesive coating and impregnating process, the ceramic-metal bonding process and the ceramics-light transmitting part bonding process may further includes the following steps. That is, the adhesive preparation process includes dissolving first and second resin materials as the adhesive into the water or water soluble organic solvent, which resin materials both melt with heat respectively at a first melting temperature a and a second melting temperature b (a>b), both melting temperatures being higher than the given temperature, and have flexibility when they have been hardened and formed a bond, thus preparing a first hot melt and a second hot melt. The adhesive coating and impregnating process includes employing as the ceramic part, a ceramic part having the given bonding surface region comprised of a first bonding surface region and a second bonding surface region, coating the first and second hot melts prepared in the adhesive preparation process respectively to the first and second bonding surface regions and impregnating these hot melts into pores in the first and second bonding surface regions under a given vacuum pressure. The ceramics-metal boding process includes bringing the first hot melt impregnated in the ceramic part in the adhesive coating and impregnating process into a molten state between the ceramic part and the metallic part at a first bonding temperature that is equal to or higher than the first melting temperature a, thereby bonding the ceramic part to the metallic part. The ceramics-light transmitting part bonding process includes, after bonding the ceramic part to the metallic part in the ceramics-metal bonding process, bringing the second hot melt impregnated in the ceramic part in the adhesive coating and impregnating process into a molten state between the ceramic part and the light transmitting part at a second bonding temperature that is equal to or higher than the second melting temperature b but lower than the first melting temperature a, thereby bonding the ceramic part to the light transmitting part (e.g., the optical part). With this method, even if the light transmitting part (e.g., the optical part) is bonded to the ceramic part with the second hot melt after bonding the metallic part to the ceramic part with the first hot melt, it is possible to prevent the melting of the first hot melt that bonds the metallic part to the ceramic part, when the light transmitting part (e.g., the optical part) is bonded to the ceramic part with the second hot melt.

The given temperature mentioned above is preferably lower than a performance guarantee temperature of a semiconductor element (e.g., a light emitting element when the light emitting device is provided in the form of a light emitting diode) provided to the light emitting device. This given temperature may be in the range of about 100° C.–150° C. In this case, the melting temperature maybe set higher than this range of about 100° C.–150° C. Also, the bonding temperature, which is equal to or higher than the melting temperature, is preferably in the range of about 180° C.–300° C. This is because when the bonding temperature exceeds around 300° C., the characteristic deterioration of the resin of the hot melt may be caused. In the conventional bonding method using brazing materials, the bonding is generally made under heat at a temperature range of about 500° C.–800° C. In this regard, according to the present invention, the bonding is made at a significantly lower temperature (e.g., 180° C.–300° C.) than the conventional bonding temperature of about 500° C.–800° C., so that the light emitting devices can be manufactured with high efficiency and therefore the manufacturing costs thereof can be reduced.

In the method of manufacturing the light emitting device of the present invention, the ceramics-metal bonding process may be made by bringing the hot melt into a molten state between the ceramic part and the metallic part at the bonding temperature and under a given pressure, thereby bonding the ceramic part to the metallic part, or where the bonding surface region of the ceramic part includes the first bonding surface region, by bringing the first hot melt into a molten state between the ceramic part and the metallic part at the first bonding temperature and under the given pressure, thereby bonding the ceramic part to the metallic part.

Also, the ceramics-light transmitting part bonding process may be made by bringing the hot melt into a molten state between the ceramic part and the light transmitting part (e.g., the optical part) at the bonding temperature and under the given pressure, thereby bonding the ceramic part to the light transmitting part (e.g., the optical part), or where the bonding surface region of the ceramic part includes the second bonding surface region, by bringing the second hot melt, which has been coated and impregnated in the ceramic part in the adhesive coating and impregnating process, into a molten state between the ceramic part and the light transmitting part (e.g., the optical part) at the second bonding temperature and under the given pressure after bonding the ceramic part to the metallic part in the ceramics-metal bonding process, thereby bonding the ceramic part to the light transmitting part (e.g., the optical part).

The given pressure is not necessarily limited to a specific pressure level, but is preferably in the range of about $9.8 \times 10^4$ Pa–$294.2 \times 10^4$ Pa (1 kg/cm$^2$–30 kg/cm$^2$).

Herein, given the case that as the adhesive, commonly used two-component adhesive or thermosetting adhesive is used, and it is impregnated into pores of the ceramic part under vacuum, the adhesive starts to cure during the vacuum impregnation. This necessitates to carry out the vacuum impregnation while holding a part to be bonded to the ceramic part (a bonding part) in contact with the ceramic part via the adhesive. However, with the bonding part held in contact with the ceramic part via the adhesive, uneven distribution of an adhesive layer may occur by air forced out of the pores of the ceramic part, or other problem may be caused, which leads to insufficient vacuum impregnation and hence poor bonding capability.

In the above regard, in the method of manufacturing the light emitting device of the present invention, where the adhesive drying process is carried out after the vacuum impregnation of the hot melt into the ceramic part, and the metallic part (or additionally the light transmitting part (e.g., the optical part) is provided after the vacuum impregnation and drying of the hot melt, the ceramic part can be bonded to the metallic part (and additionally to the light transmitting part (e.g., the optical part) when it is provided) by heating them to the bonding temperature.

In a case where the light emitting device of the present invention is provided in the form of a light emitting diode provided with a light emitting element, it is preferable to locate the light emitting element about 0.5 mm–2 mm away from the top surface of a peripheral edge of the metallic part or the ceramic part in order to achieve the second object. With this arrangement, light from the side of the light emitting element is easy to be directly emitted to the outside, which contributes to efficient utilization of light. In a case where the light emitting diode is utilized as a lighting equipment and light from the light emitting element is corrected through a lens or the like, light emitted from the side of the light emitting element and reflected on the ceramic part is sufficiently limited, thereby achieving reduction of the occurrence of inconsistent light correction.

Accordingly, light emitted from the side of the light emitting element can be efficiently and effectively utilized with less inconsistent light correction.

The light emitting element may be provided to the metallic part or the ceramic part via an element mounting part for mounting the light emitting element thereon. This element mounting part may include a so-called a submount that has a small-size circuit with a circuit pattern formed thereon. This submount may be made of such as aluminum nitride (AlN), aluminum oxide ($Al_2O_3$) or other ceramic material having a relatively high thermal conductivity. In a case where the submount is made of a ceramic material, it may be constituted as an integral part of the ceramic part.

Only the interposition of the element mounting part between the metallic or ceramic part and the light emitting element is likely to invite deterioration in thermal conductivity and hence deterioration in heat release capability for releasing heat from the light emitting element. Therefore, it is preferable to enlarge the contacting area of the element mounting part to the metallic or ceramic part. On the other hand, it is preferable to have an arrangement that prevents the element mounting part from blocking light emitted from the side of the light emitting element towards the element mounting part. In consideration of this, the light emitting element is preferably formed into a tapered shape, allowing itself to be gradually smaller to a light emitting element mounting side. In this regard, the element mounting part may be of a trapezoidal cube as viewed from the lateral side, or trapezoidal cube with its slanting sides stepwisely formed. The slant angle of this element mounting part is preferably in the range of about 10°–30°. By the slant angle is meant an angle formed by the plane extending vertically from each side of a top surface of the element mounting part and a corresponding slanting surface.

The element mounting part has a light emitting element mounting side, which is preferably of a size or dimension approximate as much as possible to the size or dimension of the light emitting element so as to prevent itself from blocking light emitted from the side of the mounted light emitting element. For example, the light emitting element mounting part may have a mounting side sized or dimensioned so that, with the light emitting element mounted on this mounting side, the mounting part has a peripheral surface area extending about 0.1 mm–0.5 mm from a peripheral edge of the light emitting element. Whereby, it is possible to utilize light emitted from the side of the light emitting element (e.g. light emitted from the side of the light emitting element at an angle of about 5 closer to the element mounting part than the horizontal).

With the light emitting device having the above arrangement, that is, the element mounting part having a tapered shape allowing itself to be smaller to the element mounting part, and the larger element mounting side of the element mounting part with its peripheral edge extending about 0.1 mm–0.5 mm from the peripheral edge of the light emitting element mounted thereon, it is possible to improve the heat release capability for releasing the heat from the light emitting element, while limiting the deterioration of light emitting efficiency from the side of the light emitting element.

The light emitting element may be of cubic shape having a square or rectangular light-emitting surface of 1 $mm^2$–9 $mm^2$. While not limiting to a specific size or dimension, the light emitting element may be sized or dimensioned so that when c'=1 mm, d'=1 mm–9 mm, when c'=2 mm, d'=1 mm–4 mm, and when c'=3 mm, d'=1 mm–3 mm or the like, wherein c' is a length of one pair of opposite sides and d' is a length of another pair of opposite sides.

The heat release capability for releasing the heat from the light emitting element and the element mounting part to the outside via the metallic part and the ceramic part shows a saturation characteristic relative to the size or dimension of a side of the metallic or ceramic part, on which side the light emitting element is mounted. More specifically, the enlargement of this light emitting element mounting side exceeding a certain level merely results in an enlargement of the package size, while hardly contributing to the heat release capability. Therefore, it is preferable to set a minimum package size.

For example, in a case where the light emitting device of the present invention is provided in the form of a high-electric and high-optical power light emitting diode with the metallic part made of a metallic material such as Cu having a relatively high thermal conductivity, and the light emitting element of cubic shape having a square or rectangular light-emitting surface of about 1 $mm^2$–9 $mm^2$, the metallic part or ceramic part may have a side of about 81 $mm^2$–144 $mm^2$ and a shape such as a square or rectangular shape which contains the shape of the light-emitting surface of the light emitting element, in which the light emitting element is mounted to this square or rectangular side of the metallic or ceramic part. With the thus arranged light emitting device, it is possible to achieve a minimum package size, while keeping the heat release capability required for releasing the heat from the light emitting element and the element mounting part to the outside via the metallic part, the ceramic part and the like. Although no limitation is given, the metallic or ceramic part may be sized or dimensioned so that when c=9 mm–12 mm, d=9 mm–12 mm or the like, wherein c is the length of one pair of opposite sides and d is the length of another pair of opposite sides.

The lighting equipment conceived in order to achieve the third object of the present invention includes the light emitting device of the present invention or a light emitting device manufactured by the manufacturing method of the present invention and at least a pair of positive and negative terminals for power supply to the light emitting device, in which the terminals comprise at least one of a first pair of terminal sections and a second pair of terminal sections, the first pair of terminal sections adapted to support the light emitting device from the side of the same and the second pair of terminal sections adapted to support a first main-side of the light emitting device; and at least one of the first and second pair of terminal sections are designed to clamp the light emitting device.

With the above arrangement, the terminals securely hold the light emitting device by the contact with the main side and/or the side end of the light emitting device, thereby preventing unintentional rolling or moving of the light emitting device while keeping power supply to the light emitting device. Further, as compared with a conventional light emitting device, the contacting area between the light emitting device and the terminals is large, and therefore the heat release capability of the lighting equipment can be improved. Also, the light emitting device, which is clamped by the terminals via the side or the main side such as by elastic force, can be easily attached or detached by properly adjusting the elastic force of the terminals. Accordingly, it is possible to easily remove only the light emitting device from the lighting equipment for repair or the like.

The light emitting device has a second main side, which is opposite to the first main side, supported on a heat transfer unit. This heat transfer unit improves the heat release capability of the light emitting device, thus achieving a high-brightness lighting equipment.

The light emitting device has a light-emission observation side located opposite to a right reflection surface. This arrangement allows the lighting equipment to emit light from the light emitting device in a desirable direction.

The light reflection surface is made of a metallic material. With this, it is possible to further improve the reflectance on the reflection surface.

The light reflection surface releases heat transmitted by the heat transfer unit. With this, it is possible to further improve the heat release capability of the lighting equipment.

BRIEF DESCRIPTION OF THE DRAWINGS

The above, and other objects, features and advantages of the present invention will become apparent from the detailed description thereof in conjunction with the accompanying drawings wherein.

FIG. 5 is a graph illustrating the relative characteristics of the slant angle of the submount, the temperature increase value and the contacting area of a Cu part with the submount.

It is to be noted that a part or all the drawings are intended to illustrate the schematic arrangement only for illustration of the present invention, while not intended to illustrate every detail of the elements such as each relative size, position and the like.

DETAILED DESCRIPTION OF THE PREFERRED EMBODIMENT

Now, the description will be made for the embodiments of the present invention with reference to the drawings attached hereto.

Figure 1:
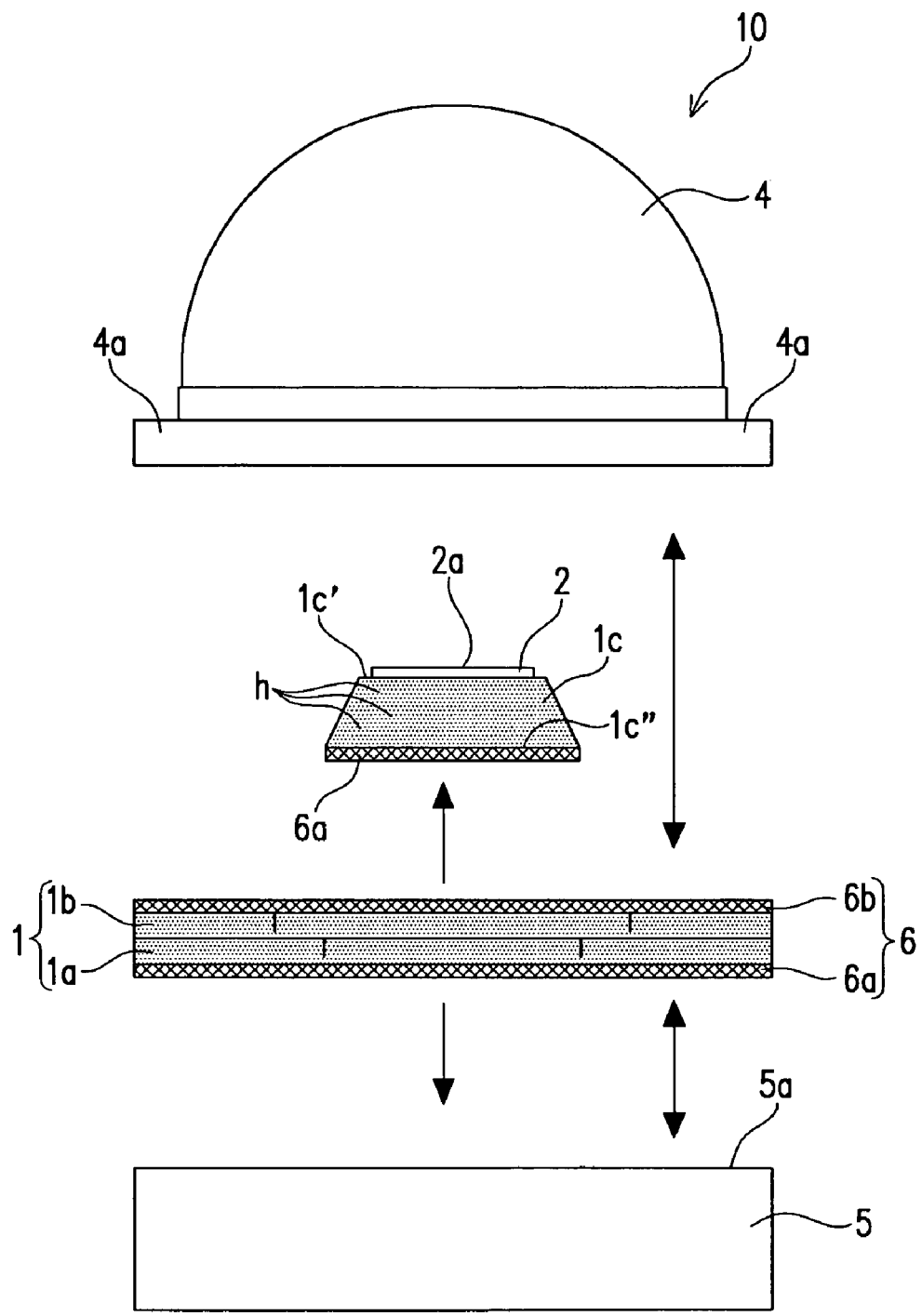
FIG. 1 is a schematic, exploded elevational view of a light emitting diode as an example of the light emitting device according to the present invention.

FIG. 1 is a schematic, exploded elevational view of a light emitting diode 10 as one example of the light emitting device according to the present invention.

Figure 2:
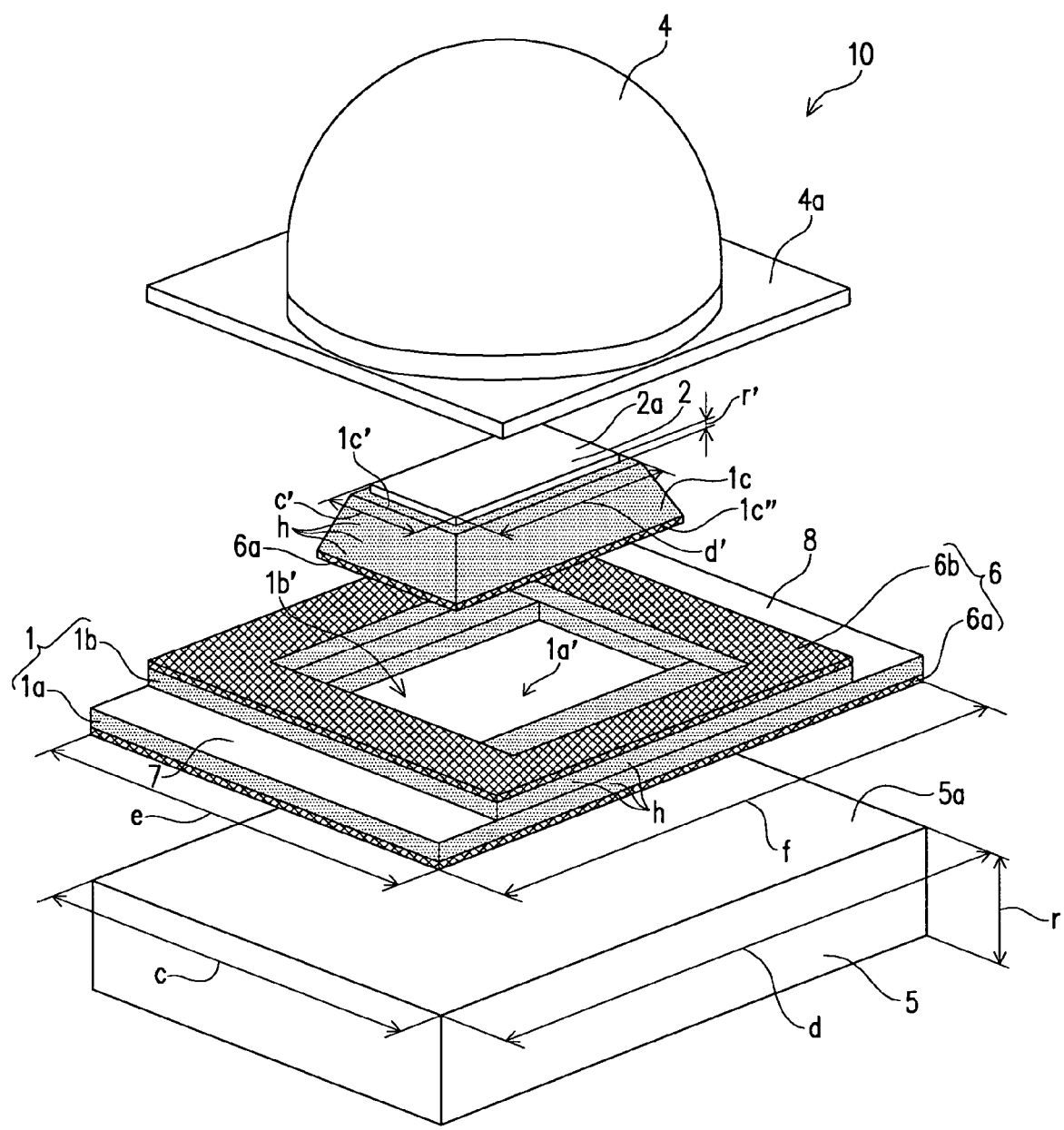
FIG. 2 is a schematic, exploded perspective view of the light emitting diode of FIG. 1.
Figure 3:
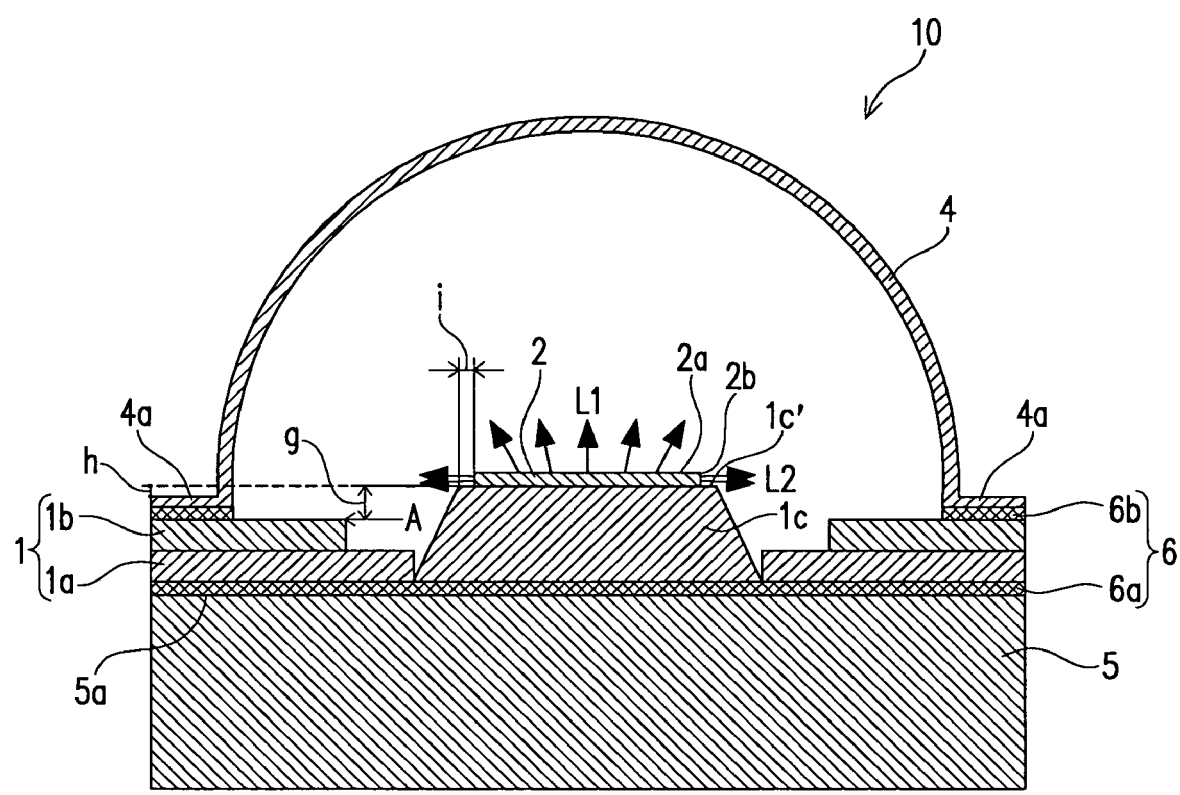
FIG. 3 is a schematic cross sectional view of the light emitting diode of FIGS. 1 and 2.

FIG. 2 is a schematic, exploded perspective view of the light emitting diode 10 of FIG. 1. FIG. 3 is a schematic cross sectional view of the light emitting diode 10 of FIGS. 1 and 2.

The light emitting diode 10 (hereinafter referred to an LED) includes a packaging ceramic part 1, a light emitting element 2, a light transmitting part 4, a heat-release metallic part 5 and hot melt 6.

The ceramic part 1 is made up of first and second plate sections 1a, 1b made of ceramics (AlN, $Al_2O_3$ or the like in this example), both are overlapped to each other, and a submount (an example of the element mounting part) 1c. The first plate section 1a is of a square or rectangular shape having a given size (one side ("e" in FIG. 2): approx. 9 mm–12 mm, the other side ("f" in FIG. 2): approx. 9 mm–12 mm), and has a first rectangular opening 1a' slightly larger than a bottom surface 1c" of the submount 1c. The second plate section 1b has a first pair of opposite sides that are substantially the same in length as the corresponding opposite sides of the first plate section 1a, and a second pair of opposite sides that are shorter in length than the corresponding opposite sides of the first plate section 1a, as well as having a second opening 1b' larger than the first opening 1a' of the first plate section 1a. In this example, the first and second plate sections 1a, 1b are made of the same material.

The submount 1c is a "submount" mounted with the light emitting element 2 having a small-size circuit with a circuit pattern or the like formed thereon and made of a ceramic material having a relatively high thermal conductivity, such as AlN and $Al_{2O3}$. This submount 1c is tapered so as to be gradually smaller to its side on which the light emitting element 2 is mounted (a light emitting element mounting side) and specifically of a trapezoidal cube as viewed from the lateral side as illustrated in FIGS. 1–3, or the trapezoidal cube with its slanting sides stepwisely formed. A ceramic material of the submount 1c and the first and second plate sections 1a, 1b have a porous structure that has pores h distributed throughout the material including the surface region in this example. The porosity is about 5%–20% and the pore size is about 0.01 mm–0.15 mm. Within these value ranges, the highest thermal conductivity is achieved by setting the porosity to 5%.

In this example, the submount 1c has a mounting side 1c' that is larger than the light emitting element 2 so that, with the light emitting element 2 mounted on this side, the submount 1c has a peripheral surface area extending about 0.1 mm–0.5 mm ("i" in FIG. 3) from a peripheral edge of a light emitting surface 2a of the light emitting element 2, so as not to prevent the submount 1c from blocking light L2 emitted from the side of the light emitting element 2 mounted in position. The light emitting element 2 is mounted on the light emitting side 1c' of the submount 1c. This submount 1c extends through the first opening 1a' of the first plate section 1a and is mounted on the metallic part 5.

In this example, the light emitting element 2 is of cubic shape having the light emitting surface with an area (lengths c'×d' in FIG. 2) of about 1 $mm^2$-9 $mm^2$ (e.g., when c'=2 mm, d'=1 mm–4 mm). As illustrated in FIG. 3, the light emitting element 2 is located away from a top surface A of the peripheral edge of the ceramic part 1 (more specifically, a top surface of the second plate section 1b) by about 0.5 mm–2 mm (a distance represented by "g" in FIG. 2) via the submount 1c mounted with the light emitting element 2. Power is supplied to this light emitting element 2 to emit light L1, L2 from the light-emitting surface 2a and a light-emitting side surface 2b. At this time, the light emitting element 2 generates heat along with light emission, thereby causing temperature rise of the LED 10.

As illustrated in FIGS. 1–3, the light transmitting part 4 is a glass lens of a dome shape with a hollowed hemisphere, and is designed to substantially radially direct light passing therethrough, which is emitted from a light source located at substantially the center of the dome-shaped light transmitting part 4. This light transmitting part 4 has a peripheral edge that provides a bonding section 4a that has a main surface opposite to a bonding surface to be bonded to the second hot melt 6b. A top surface A of a peripheral edge of the main surface of the light transmitting part 4 is preferably lower in height than a top surface of the submount 1c that provides a mounting surface for the light emitting element 2. That is, as illustrated in FIG. 3, it is preferable to have a distance h. Whereby, light L2 from the light-emitting side surface 2b is emitted through the dome-shaped glass lens of the light transmitting part 4, while not being blocked by the bonding section 4a of the light transmitting part 4, the second hot melt 6b or the like. Accordingly, it is possible to efficiently utilize the light L2 emitted from the side of the light emitting element 2. The light transmitting part 4 is preferably bonded with the second hot melt 6b in an inert gas such as nitrogen gas atmosphere because this inert gas is sealed in the hollowed portion of the light transmitting part 4 and hence water, which may be introduced into the hollowed portion when the bonding is made in air, is not introduced thereinto.

Accordingly, adverse effects to the light emitting element 2, a conductive material (e.g., Ag paste) that is an adhesive of the light emitting element 2, and the like due to water are omitted so that a highly reliable light emitting device can be provided. As long as a material of the light transmitting part has light-transmitting characteristics, it is not necessarily limited to a specific material. Various materials such as inorganic materials having an excellent weather resistance such as silica gel, silicone resin, epoxy resin, urea resin, or fluorocarbon resin, or a hybrid resin containing at least one of these resins, or another light transmitting resin having an excellent weather resistance. The light transmitting part may be mixed with various materials such as a viscosity improver, light diffusion agent, pigment, fluorescent material or the like according to the application thereof. For example, as a light diffusion agent, it can be cited barium titanate, titanium oxide, aluminium oxide, silicon oxide, silicon dioxide, heavy calcium carbonate or light calcium carbonate, or a mixture containing at least one of them. The light transmitting part 4 is not necessarily limited to a dome shape, but may be of a meniscus lens shape, a shape having a substantially oval as viewed from the light-emission observing side, or a shape made up of the combination of these shapes.

The metallic part 5 is made of Cu having a relatively high thermal conductivity in this example, and has a square or rectangular surface 5a including the shape of the light-emitting surface 2a of the light emitting element 2, with an area (c×d in FIG. 2) of about 81 mm$^2$–144 mm$^2$ (e.g., when c=9 mm–12 mm, d=9 mm–12 mm). The light emitting element 2 is mounted on this surface 5a via the submount 1c. In this example, the metallic part 5 has the same size as that of the first plate section 1a.

The hot melt 6 is designed to melt with heat at a melting temperature higher than a given temperature (approx. 100° C.–150° C. in this example) and has flexibility when it has been hardened and formed a bond. This hot melt 6 includes a first hot melt 6a for bonding the surface 5a of the metallic part 5 to a surface of the ceramic part 1 (more specifically, a surface constituted by a surface of the first plate section 1a and the bottom surface 1c" of the submount 1c), and a second hot melt 6b for bonding the bonding section 4a of the light transmitting part 4 to the opposite surface of the ceramic part 1 (more specifically the surface of the second plate section 1b), in which the relationship between a melting temperature a of the first hot melt 6a and a melting temperature b of the second hot melt 6b is a>b. The hot melt 6 has a modulus of elasticity in the order of 0.2×10$^8$ Pa–13.0×10$^8$ Pa and a thickness in the order of 0.01 mm–0.10 mm. When this thickness is smaller than about 0.01 mm, the bonding capability of the hot melt 6 is easy to be deteriorated, and when it is larger than about 0.10 mm, the thermal conductivity of the hot melt 6 is easy to be deteriorated.

The first hot melt 6a is impregnated into the pores h in a first bonding surface region of the ceramic part 1, while the second hot melt 6b is impregnated into the pores h in a second bonding surface region of the ceramic part 1, which is opposite to the first bonding surface region. The opposite side of the first plate section 1a has a positive power supply part 7 and a negative power supply part 8 to be respectively connected to external electrodes. The first plate section 1a and the second plate section 1b may be bonded together by the first hot melt 6a and the first hot melt 6a may be impregnated in the pores h of the bonding surface regions of the first and second plate sections 1a, 1b.

According to the thus arranged LED 10, the adhesive for bonding between the metallic part 5 and the ceramic part 1 is the hot melt 6 that has flexibility when it has been hardened and formed a bond. Therefore, this hot melt 6 can absorb stress caused by the temperature rise of the metallic part 5 and the ceramic part 1, thereby preventing a problem due to the difference in coefficient of linear expansion between the metallic part and the ceramic part at the time of temperature change, such as warping or break (crack) of the ceramic part. As a result, a metallic material (copper (Cu) in this example) having a relatively high thermal conductivity can be used as a material of the metallic part 5, thus achieving a high-electric power and high-optical power light emitting diode never achieved before, which has a light emitting characteristic with a high brightness. The impregnation of the hot melt 6 in the pores h of the bonding surface region of the ceramic part 1 achieves tightened bonding of the hot melt 6 with the pores h, thereby achieving improved bonding strength of the hot melt 6 to the ceramic part 1. Accordingly, even if the thickness of the hot melt 6 when it has been hardened and formed a bond is set to be relatively small, it is possible to maintain a good bonding capability and correspondingly improve the thermal conductivity of the hot melt 6.

With the relationship of a>b wherein a: the melting temperature of the first hot melt 6a, and b: the melting temperature of the second hot melt 6b, even if the light transmitting part 4 is bonded to the ceramic part 1 with the second hot melt 6b after bonding the metallic part 5 to the ceramic part 1 with the first hot melt 6a, it is possible to prevent melting of the first hot melt 6a that bonds the metallic part 5 to the ceramic part 1, when bonding the light transmitting part 4 to the ceramic part 1 with the second hot melt 6b.

In the LED 10, the light emitting element 2 is provided so as to be located away from the top surface A of the peripheral edge of the ceramic part 1 with the distance g=about 0.5 mm–2 mm. This facilitates light L2 emitted from the light-emitting side surface 2b of the light emitting element 2 to be directly emitted to the outside, and thus achieving efficient utilization of light. Also, even in a case where the LED 10 is utilized as a lighting equipment or the like and light L1, L2 emitted from the light emitting element 2 is corrected by the light transmitting part 4, light emitted from the light-emitting side surface of the light emitting element 2 and reflected on the ceramic part 1 is sufficiently limited, thereby achieving reduction of the occurrence of inconsistent light correction. Accordingly, light L2 emitted from the side 2b of the light emitting element 2 can be efficiently and effectively utilized without inconsistent light correction.

Further, according to the LED 10, the submount 1c is tapered so as to be gradually smaller to the light-element mounting side, and it is provided the mounting side 1c' that is larger than the light emitting element 2 so that, with the light emitting element 2 mounted on this side, the submount 1c has a peripheral surface area extending about 0.1 mm–0.5 mm ("i" in FIG. 3) from the peripheral edge of the light-emitting surface 2a of the light emitting element 2. As a result, the light L2 emitted from the light-emitting side surface 2b of the light emitting element 2 at an angle about 5° closer to the submount 1c than the horizontal can be utilized, so that it is possible to improve heat release capability for releasing heat from the light emitting element 2, while limiting the deterioration in light emission efficiency of the light L2 from the light-emitting side surface 2b of the light emitting element 2.

Further, in the LED 10, the light emitting element 2 is of cubic shape with a square or rectangular light-emitting surface of about 1 mm$^2$–9 mm$^2$, while the metallic part 5 made of Cu has the square or rectangular surface 5a of about 81 mm$^2$–144 mm$^2$, which is such a shape as to include the shape of the light-emitting surface 2a of the light emitting element 2, and this surface 5a is mounted thereon with the light emitting element 2. This arrangement makes it possible to maintain the heat release capability for releasing heat from the light emitting element 2 and the submount 1c to the outside via the metallic part 5, the ceramic part 1 and the like, and achieve a minimum package size.

Now, the description will be made for an example of the manufacturing method of the LED 10 of FIGS. 1–3.

In order to manufacture this LED 10, the hot melt 6 is first prepared by dissolving into water or water soluble organic solvent (e.g., a mixed solvent of dimethyl ethyl ketone and dimethylformamide) a resin material that melts with heat at a melting temperature higher than a given temperature (herein 150° C.) and has flexibility when it has been hardened and formed a bond. More specifically, taking into account that the light transmitting part 4 is bonded to the ceramic part 1 after bonding the metallic part 5 to the ceramic part 1 and providing thereto the light emitting element 2, the first hot melt 6a, which melts with heat at the first melting temperature a (=250° C.) higher than 150° C. and has flexibility when it has been hardened and formed a bond, is prepared by dissolving into the water or water soluble organic solvent a thermoplastic elastomer, an ethylene-vinyl acetate copolymer, an ethylene acrylate copolymer and polyethylene, adding polyimide as a thermosetting resin thereinto, and agitating and mixing them evenly. Also,
the second hot melt 6b, which melts with heat at the second melting temperature b (=180° C.) higher than 150° C. and lower than the first melting temperature a (=250° C.) (a>b) and has flexibility when it has been hardened and formed a bond, by dissolving into the water or water soluble organic solvent a thermoplastic elastomer, an ethylene-vinyl acetate copolymer, an ethylene acrylate copolymer and polyethylene, adding polyimide as a thermosetting resin thereinto, and agitating and mixing them evenly.

Each of those components in the first resin composition is contained herein in a proportion in the range:
Thermoplastic elastomer: approx. 24.9 wt. % (limiting viscosity: 1.2 dl/g)
Ethylene-vinyl acetate copolymer: approx. 24.9 wt. %
Ethylene acrylate copolymer: approx. 24.9 wt. %
Polyethylene: approx. 24.9 wt. %, and
Polyimide: approx. 0.3 wt. %.

Each of those components in the second resin composition is contained herein in a proportion in the range:
Thermoplastic elastomer: approx. 24.9 wt. % (limiting viscosity: 0.6 dl/g)
Ethylene-vinyl acetate copolymer: approx. 24.9 wt. %
Ethylene acrylate copolymer: approx. 24.9 wt. %
Polyethylene: approx. 24.9 wt. %, and
Polyimide: approx. 0.3 wt. %.

In this example, as the thermoplastic elastomer, a styrene thermoplastic elastomer and more specifically styrene-isoprene-styrene block copolymer is used, in which as the first resin composition, the one with a limiting viscosity ($\eta$) of 1.2 dl/g and as the second resin composition, the one with a limiting viscosity ($\eta$) of 0.6 dl/g is used. Herein, making the melting temperatures of the first and second resin compositions different from each other depends on the limiting viscosity ($\eta$) of the thermoplastic elastomer. More specifically, "low high" of the melting temperature is achieved by "small large" relationship of the limiting viscosity ($\eta$). As such, in this example, the low high of the melting temperature is achieved by changing the limiting viscosity ($\eta$) between the first and second resin compositions (on the condition that the thermoplastic elastomer of the same type is used for the first and second resin compositions). Thus, the changing of the limiting viscosity is necessitated in this example. Alternatively, the same can be achieved by employing different materials for the thermoplastic material between the first and second resin compositions. As a result, it is possible to achieve the low high of the melting temperature by changing a material of the thermoplastic elastomer between the first and second resin compositions, or setting the different limiting viscosities ($\eta$) between the first and second resin compositions (on the condition that the thermoplastic elastomer of the same type is used for the first and second resin compositions). The limiting viscosity ($\eta$) is a value determined by JIS K7367-3. According to this JIS K7367-3, a value is "the viscosity of a certain organic solvent at 135° C." and can be determined by using an Ubelode viscometer.

Then, the hot melt 6 is coated on the bonding surface region of the ceramic part 1 and impregnated into the pores h of the bonding surface region of the ceramic part 1 under a given vacuum pressure. More specifically, a vacuum chamber (not shown) is prepared, in which the first hot melt 6a is coated on one side of the first plate section 1a and a first bonding surface region of the bottom surface 1c" of the submount 1c, while the second hot melt 6b is coated on a second bonding surface region of the second plate section 1b. Then, the pressure of the inside of the vacuum chamber is reduced to a vacuum atmospheric pressure of 1 kPa or lower, thereby forming a given vacuum condition, under which the first and second hot melts 6a, 6b are impregnated into the pores h of the first and second bonding surface regions of the ceramic part 1 (1a, 1b, 1c). Then, the ceramic part 1 with the hot melt (6a, 6b) impregnated therein is hardened.

The first hot melt 6a, which has been coated, impregnated and hardened between the first side of the first plate section 1a, the bottom surface 1c" of the submount 1c and the metallic part 5, is brought into a molten state at the first bonding temperature (herein 250° C.) equal to or higher than the first melting temperature a (=250° C.) under the given pressure, thereby bonding the ceramic part 1 to the metallic part 5. Then, after bonding the ceramic part 1 to the metallic part 5, the second hot melt 6b, which has been coated, impregnated and hardened between the surface of the second plate section 1b and the light transmitting part 4, is brought into a molten state at the second bonding temperature (herein 180° C.) equal to or higher than the second melting temperature b (=180° C.) but lower than the first melting temperature a (=250° C.) under the given pressure, thereby bonding the ceramic part 1 to the light transmitting part 4. The thickness of the first and second hot melts 6a, 6b are set in the range of 20 μm–200 μm, and the given pressure is set in the range of $9.8 \times 10^4$ Pa–$294.2 \times 10^4$ Pa.

As described, according to the above example, the hot melt 6 prepared as the adhesive is coated on the bonding surface region of the ceramic part 1 and impregnated into the pores h of this bonding surface region under the given vacuum pressure. Since this hot melt 6 is formed by dissolving the resin composition into the water or water soluble inorganic solvent, it is less sticky at room temperature (e.g., 25° C.) so that the hot melt 6 can be evenly impregnated into the pores h. After that, the hot melt 6 is activated by the application of heat under a bonding temperature equal to or higher than the melting temperature, allowing itself to be brought into a molten state, thereby bonding the ceramic part 1 to the metallic part 5. The hot melt 6, which has been impregnated into the pores h of the bonding surface region of the ceramic part 1 under vacuum, can provide a better bonding strength of the hot melt 6 with the pores h. Thus, the LED 10 of FIGS. 1–3 can be manufactured.

According to the above manufacturing example, which manufactures the LED 10 of FIGS. 1–3, stress caused to the metallic part 5 and the ceramic part 1 by the temperature rise can be absorbed, thereby preventing a problem, such as warping of either or both of the metallic part 5 and the ceramic part 1 or break (crack) of the ceramic part 1 at the time of the temperature change, due to the difference in coefficient of linear expansion between the metallic part 5 and the ceramic part 1. As a result, it is possible to use a metallic material (copper (Cu) in this example) having a relatively high thermal conductivity as a material of the metallic part 5 and hence achieve a high-electric power and high-optical power light emitting diode having a light emitting characteristic with a high brightness. Also, the impregnation of the hot melt 6 into the pores h of the bonding surface region of the ceramic part 1 can provide a better bonding strength of the hot melt 6 with the pores h and thereby achieve improved bonding strength of the hot melt 6 to the ceramic part 1. Accordingly, it is possible to maintain a good bonding capability even if the thickness of the hot melt 6 when it has been hardened and formed a bond is set to be relatively small, thereby providing the light emitting device 10 that can correspondingly improve the thermal conductivity of the hot melt 6.

In the above manufacturing example, the first hot melt 6a is brought into a molten state at the first bonding temperature (herein 250° C.) equal to or higher than the first melting temperature a, thereby bonding the ceramic part 1 to the metallic part 5. After bonding the ceramic part 1 to the metallic part 5, the second hot melt 6b is brought into a molten state at the second bonding temperature (herein 180° C.) equal to or higher than the second melting temperature b but lower than the first melting temperature a (a>b), thereby bonding the ceramic part 1 to the light transmitting part 4. With this relationship, even if the light transmitting part 4 is bonded to the ceramic part 1 with the second hot melt 6b after bonding the metallic part 5 to the ceramic part 1 with the second hot melt 6a after bonding the metallic part 5 to the ceramic part 1, it is possible to prevent melting of the first hot melt 6a that bonds the metallic part 5 to the ceramic part 1, when bonding the light transmitting part 4 to the ceramic part 1 with the second hot melt 6b.

In the above manufacturing example, the bonding is made at a significantly lower temperature (herein 180° C. and 250° C.) than the conventional bonding temperature of 500° C.–800° C., so that the light emitting devices 10 can be manufactured with high efficiency and therefore the manufacturing costs thereof can be reduced.

Further, given the case that as the adhesive, commonly used two-component adhesive or thermosetting adhesive is used, and it is impregnated into pores of the ceramic part under vacuum, the adhesive starts to cure during the vacuum impregnation. This necessitates to carry out the vacuum impregnation while holding a part to be bonded to the ceramic part (a bonding part) in contact with the ceramic part via the adhesive applied thereto. However, with the bonding part held in contact with the ceramic part via the adhesive, uneven distribution of an adhesive layer may occur by air forced out of the pores of the ceramic part, or other problem may be caused, which leads to insufficient vacuum impregnation and hence poor bonding capability. However, in the manufacturing example of the present invention, the metallic part 5, the light transmitting part 4 and the like are provided on the ceramic part 1 after the vacuum impregnation and drying of the hot melt 6, the ceramic part can be bonded to the metallic part and the light transmitting part 4 by heating them to the bonding temperature without deterioration of the bonding strength.

EXAMPLE 1

Figure 4A:
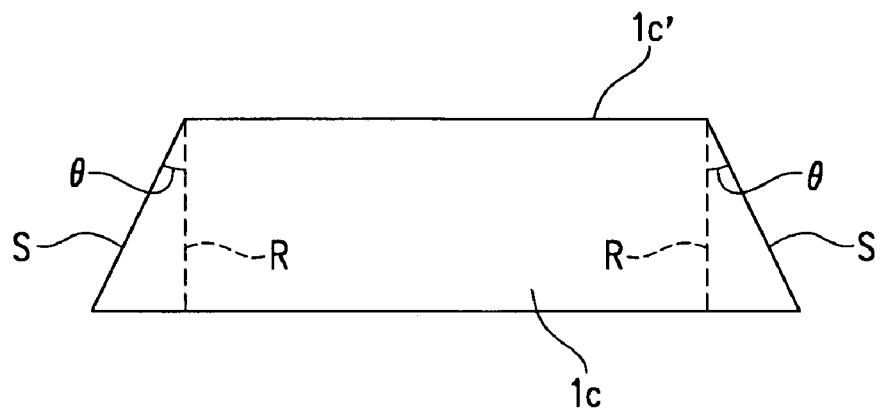
FIG. 4A is an explanatory view of the slant angle of a submount.

Now, the description will be made for the submount 1c of the LED 10 with reference to the relationship between the slant angle of the submount 1c of the LED 10, the temperature rise of the LED 10 and the contacting area of the bottom surface 1c" of the submount 1c to the surface 5a of the metallic part 5 made of Cu (hereinafter referred to a Cu part), which relationship was studied by using the LED 10 of FIGS. 1–3. As illustrated in FIG. 4A, the slant angle of the submount 1c is an angle (θ in the Figure) formed by a plane R extending vertically from each side of the top surface 1c' and a corresponding slanting surface S of the submount 1c.

Herein, the material of the ceramic part 1 is AlN and the size (e×f) is 9 mm×12 mm. The size c'×d' of the light emitting element 2 is 1 mm×2 mm and the height r' is 100 μm. The size of the top surface 1c' of the submount 1c is larger than the light emitting element 2 with the width of a portion i=0.2 mm outwardly extending from the peripheral edge of the light emitting element 2. The thickness of the first hot melt 6a for bonding the submount 1c to the Cu part 5 is 15 μm. The size c×d of the Cu part 5 is 9 mm×12 mm and the height r is 2 mm. As the slant angle θ of the submount 1c is changed, 2.5 watts is applied to the light emitting element 2.

The relative characteristics of the slant angle θ of the submount 1c, the temperature increase value, and the contacting area of the Cu part with the submount 1c is illustrated in FIG. 5. As illustrated in this Figure, the larger the slant angle θ, the better the heat release capability. However, at the same time, the contacting area of the bottom surface 1c" of the submount 1c with the surface 5a of the Cu part 5 is increased. In this regard, it is preferable to set the contacting area with the submount 1c to be small, or the size of the submount 1c to be small, in light of manufacturing costs or the like. Taking into account this heat release capability and the contacting area, the slant angle θ is preferably in the range of 10°–30°.

EXAMPLE 2

Now, the description will be made for the relationship between the size c×d of the Cu part 5 (or, the package area) of the LED 10 and the difference in temperature between the light emitting element 2 and the Cu part [(temperature Tj of the light emitting element 2)–(temperature Tcu-Plate of the Cu part 5)], which relationship was studied by using the LED 10 of FIGS. 1–3.

Figure 4B:
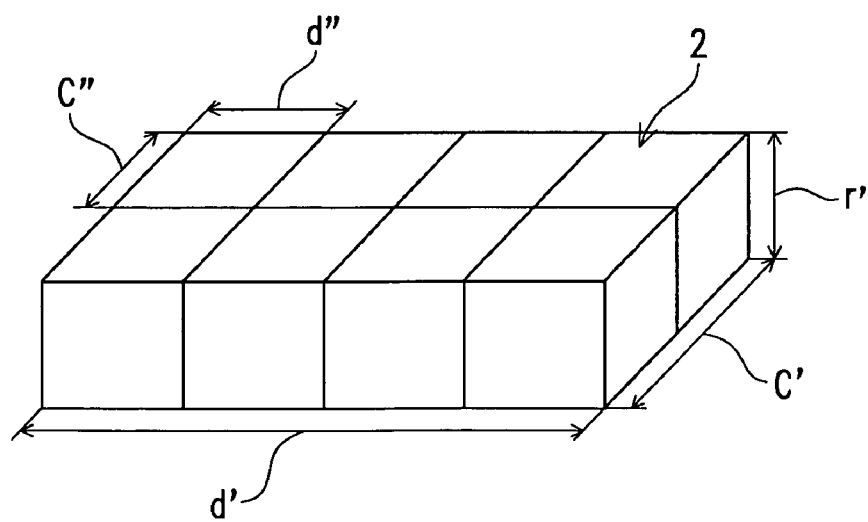
FIG. 4B is an explanatory view of a light emitting element used in a second embodiment of the present invention.

Herein, the same conditions, elements and the like as those of the first example are applied to this example, except for the light emitting element 2, the slant angle θ of the submount 1c, and the sizes of the Cu part 5 and the ceramic part 1. As illustrated in FIG. 4B, the light emitting element 2 is comprised of eight light emitting chips arranged (in a 2×4 pattern) each having a size c"×d"=1 mm×1 mm and height r'=100 μm. The slant angle θ of the submount 1c is 20°. As the package area, the size c×d of the Cu part 5 and the size e×f of the ceramic part 1 are changed in the manner: 5 mm×5 mm (□5 mm)=25 mm$^2$, 7 mm×7 mm (□7 mm)=49 mm$^2$, 9 mm×9 mm (□9 mm)=81 mm$^2$, 12 mm×12 mm (□12 mm)=144 mm$^2$, and 15 mm×15 mm (□15 mm)=225 mm$^2$. As the size is changed, 10 watts is applied to the light emitting element 2.

Figure 6:
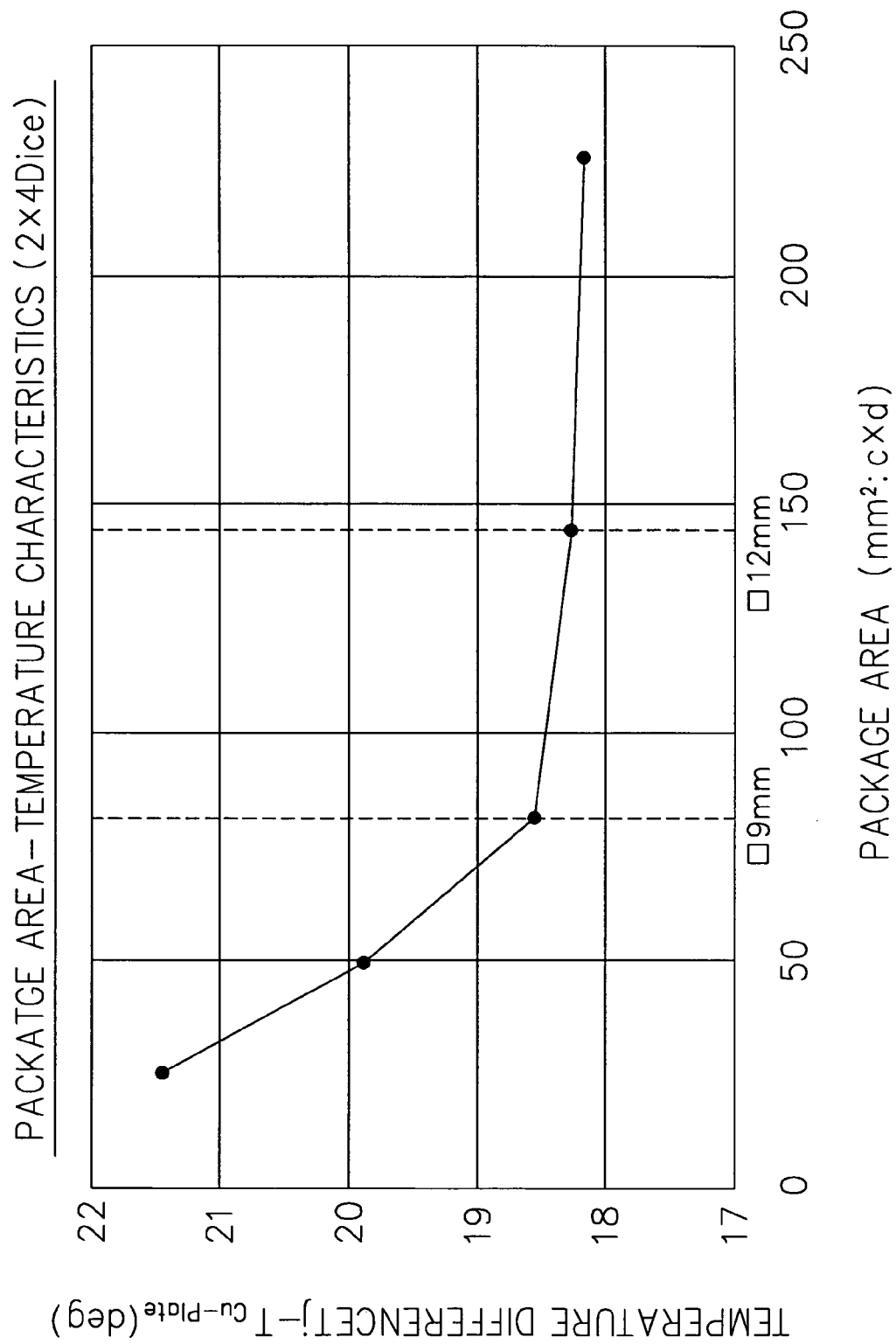
FIG. 6 is a graph illustrating the package area-temperature characteristics.

The package area-temperature characteristics is illustrated in FIG. 6. As illustrated in this Figure, the larger the package area c×d, the better the heat release capability. However, even the increase of the package area c×d to larger than about □9 mm=81 mm$^2$–□12 mm=144 mm$^2$ does not cause much change in heat release capability. As is apparent from this, the package area c×d is preferably about 81 mm$^2$–144 mm$^2$.

According to the present invention as described above, it is possible to provide a light emitting device and a method of manufacturing the same that are capable of preventing a problem due to the difference in coefficient of linear expansion between the metallic part and the ceramic part at the time of temperature change, such as warping or break (crack) of the ceramic part, hence allowing a metallic material having a relatively high thermal conductivity to be used as a material of the metallic part, and achieving a high-electric power and high-optical power light emitting diode that has a light emitting characteristic with a high brightness.

Also, according to the present invention, it is possible to provide a light emitting device that is capable of efficiently and effectively utilizing light emitted from the side of the light emitting element with less inconsistent light correction in a case where the light emitting device is provided in the form of a light emitting diode.

Now, the description will be made for embodiments of the lighting equipment of the present invention.

(First Embodiment of the Lighting Equipment)

Figure 7:
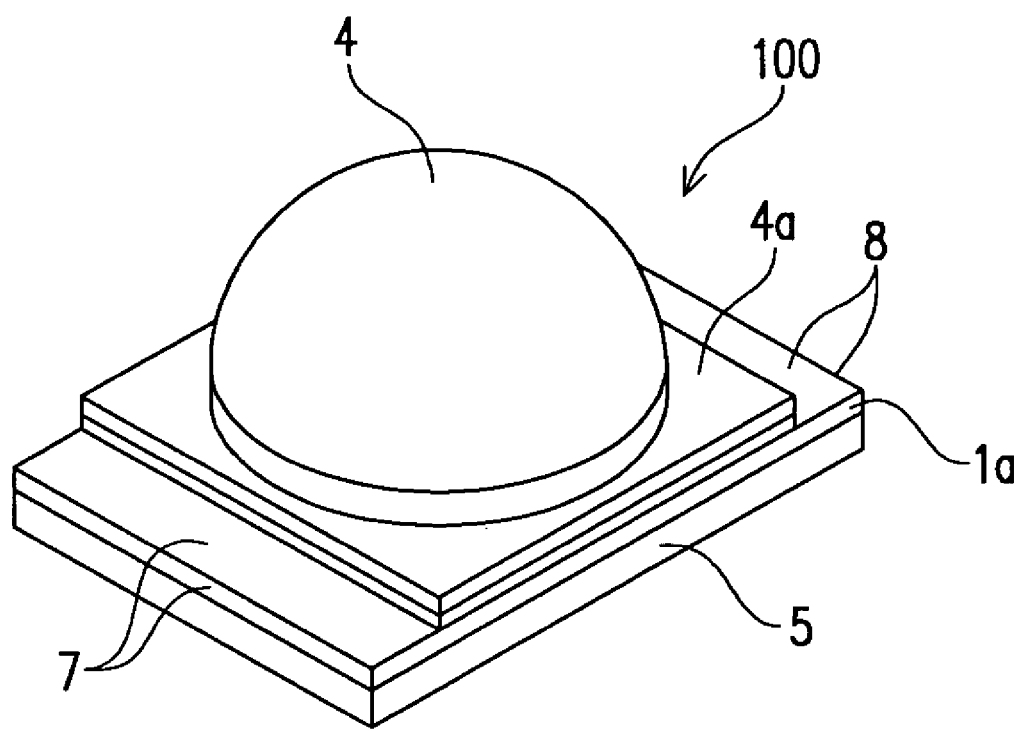
FIG. 7 is a perspective model view of a light emitting device 100 to be used in a lighting equipment according to a first embodiment of the present invention.

FIG. 7 is a perspective view illustrating an appearance of a light emitting device 100 to be used in the lighting equipment of the first embodiment of the present invention. The light emitting device 100 manufactured by the method of the present invention as described above is used. The light emitting device 100 of this embodiment has a positive power supply part 7 and a negative power supply part 8, each extending to not only the top surface of the first plate section 1a but also a corresponding side surface.

Figure 8:
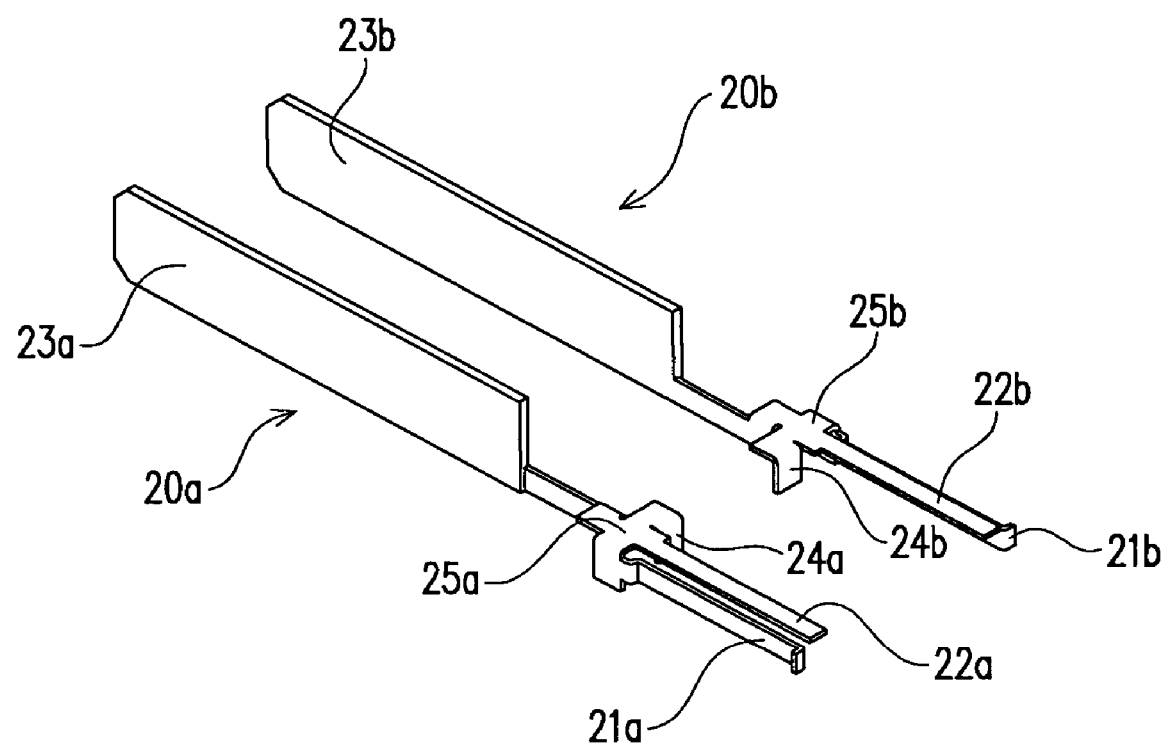
FIG. 8 is a perspective model view of terminals 20a, 20b of the lighting equipment of the first embodiment.

FIG. 8 is a perspective model view of terminals 20a, 20b of this embodiment. The terminals 20a, 20b made of a conductive material is comprised of at least a pair of positive and negative terminals for power supply to the light emitting device 100, which respectively contact the positive power supply part 7 and the negative power supply part 8. The terminals 20a, 20b include at least first terminal sections 21a, 21b made up of spring pieces elastically deforming for clamping the light emitting device 100 from the side thereof and second terminal sections 22a, 22b for supporting the light emitting device 100 from a first main-side thereof. More specifically, the terminals 20a, 20b are separated at base sections 25a, 25b thereof into the first terminal sections 21a, 21b and the second terminal sections 22a, 22b that respectively extend toward the light emitting device 100 mounted in position. With this arrangement, it is possible to achieve power supply to the light emitting device 100 while tightly fixing the light emitting device 100 in position. The terminals of this embodiment with the terminal sections located on one end also have terminal sections 23a, 23b located on the opposite end for connection with external electrodes.

Although the terminal sections 23a, 23b of this embodiment each are shaped to have a wider surface extending vertically relative to the main-sides of the light emitting device 100, as illustrated in FIG. 8, this is not essential. The terminal sections each may be shaped to have a wider surface extending horizontally relative to the main-sides of the light emitting device 100. The terminals 20a, 20b are also provided such as near the base sections 25a, 25b with positioning sections 24a, 24b, as illustrated in FIG. 8.

Figure 9:
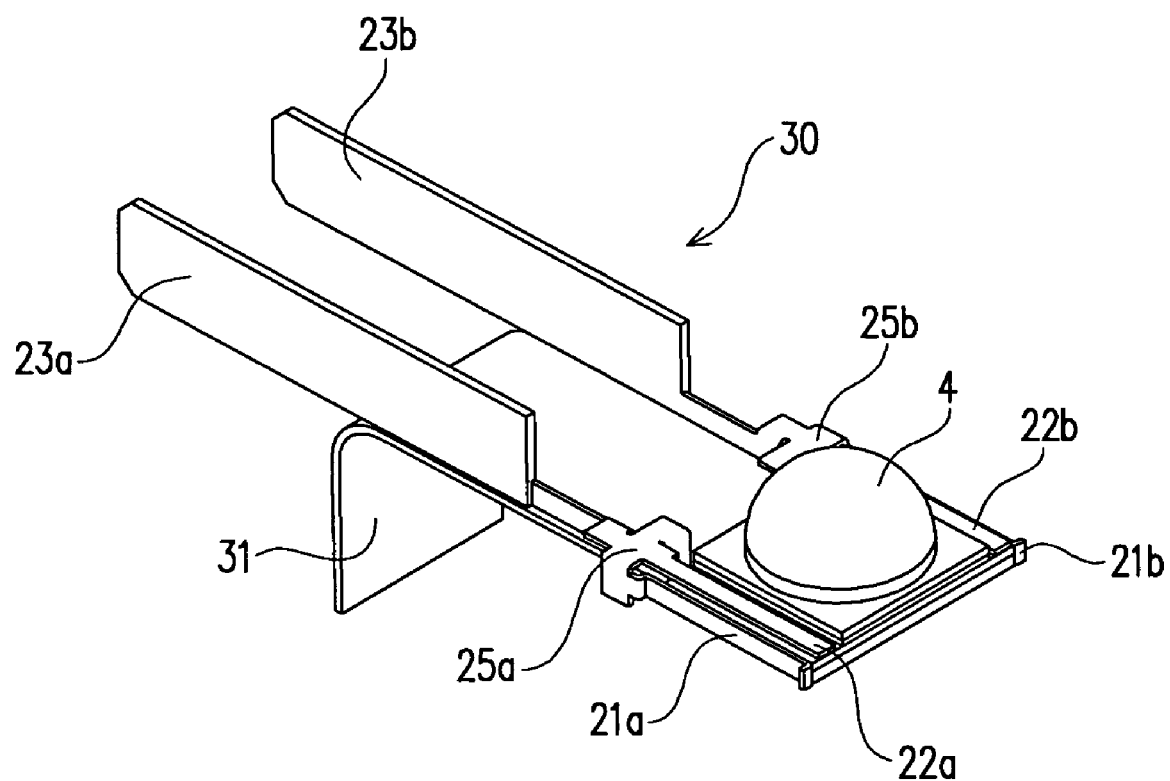
FIG. 9 is a perspective model view of the terminals 20a, 20b of the lighting equipment of the first embodiment, to which the light emitting device 100 is mounted.

FIG. 9 is a perspective model view of a lighting equipment 30 with the light emitting device 100 attached to the terminals 20a, 20b of this embodiment. In this Figure, the first terminal sections 21a, 21b as the spring pieces exert elastic force in such a direction as to clamp the light emitting device 100, thereby tightly clamping the light emitting device 100 from the side thereof. The light emitting device 100 is mounted on a plate-like heat transfer unit 31 that is designed to release heat from the rear side of the light emitting device 100. Herein, the heat transfer unit 31 is preferably bent on the rear side of the lighting equipment to release heat toward a heat releasing means such as a reflection unit. This contributes to improved heat release capability of the lighting equipment.

(Second Embodiment of the Lighting Equipment)

Figure 10:
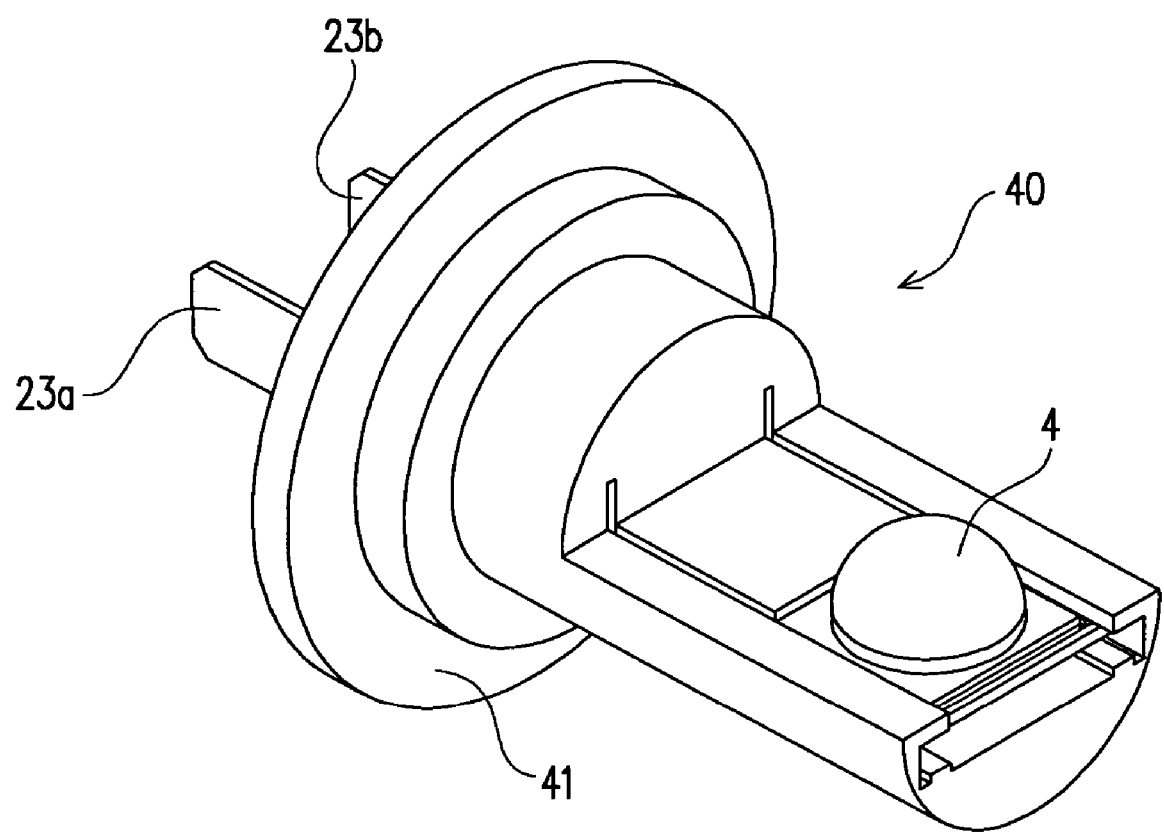
FIG. 10 is a perspective model view of a lighting equipment 40 as viewed from the front side, according to the second embodiment of the present invention.
Figure 11:
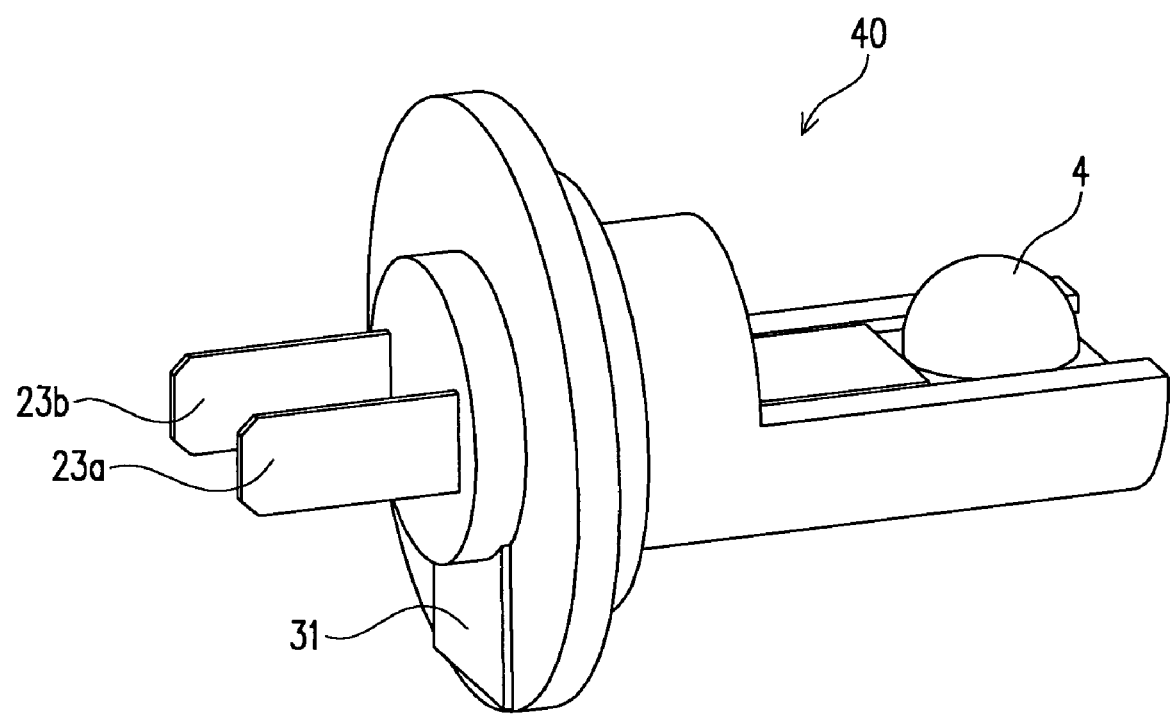
FIG. 11 is a perspective model view of the lighting equipment 40 of the second embodiment, as viewed from the rear side.

FIG. 10 is a perspective model view of the lighting equipment 40 as viewed from the front side, according to the second embodiment of the present invention. FIG. 11 is a perspective model view of the lighting equipment 40 of the second embodiment, as viewed from the rear side. In the lighting equipment 40 of this embodiment, a part of the terminals, and the light emitting device 100 are coated with a package 41 of such as a molded resin. The lighting equipment 40 of FIGS. 10 and 11 is also utilized as a lighting equipment in combination with a reflection unit. As illustrated in FIG. 11, a part of the heat transfer unit 31 is exposed to the outside from the rear side of the lighting equipment 40 and is connected to the reflection unit that is located outside. Whereby, the heat of the lighting equipment 40 can be released from a reflection surface of the reflection unit.

The package 41 used in this embodiment may be made of various materials such as liquid crystal polymer, polyphthalamide resin, polybutylene terephthalate (PBT) or any other conventionally known thermoplastic resin without limitation to a specific one. In order to efficiently reflect light from the light emitting device, a white pigment such as titanium dioxide may be mixed into the material of the package.

(Third Embodiment of the Lighting Equipment)

Figure 12:
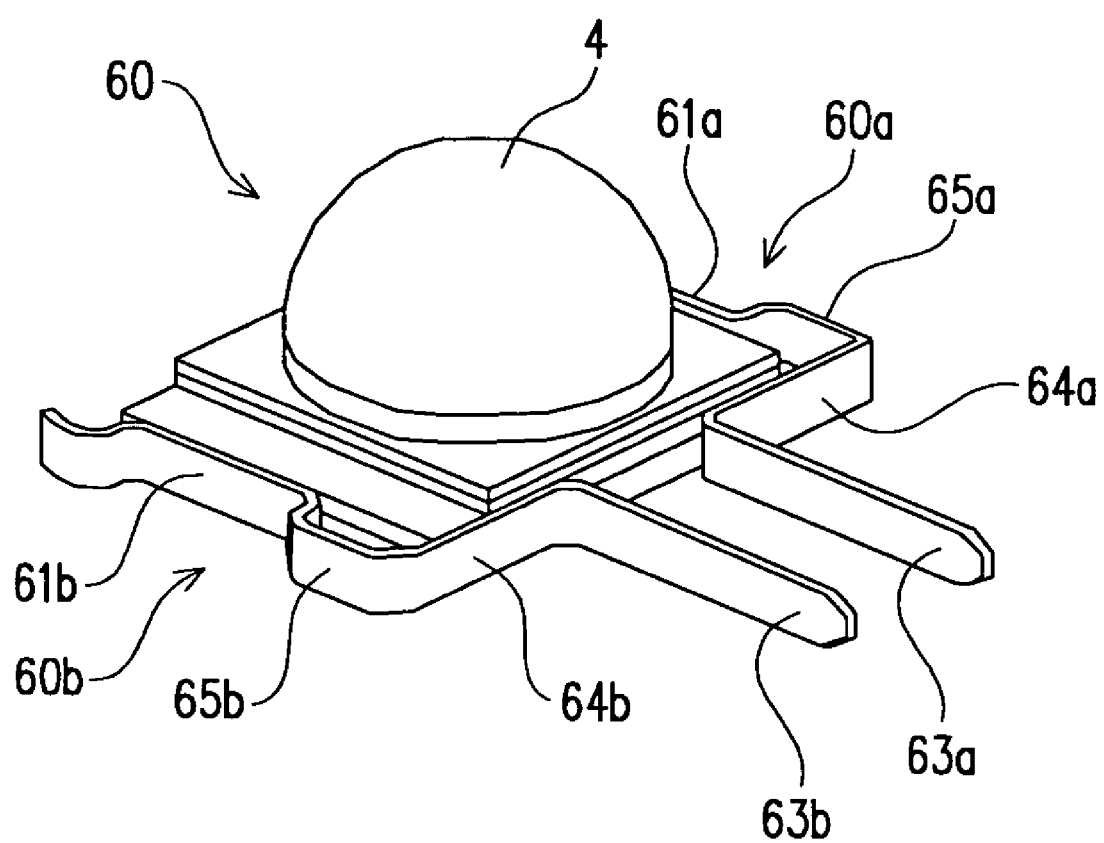
FIG. 12 is a perspective model view of a lighting equipment 60 according to a third embodiment of the present invention.

As illustrated in FIG. 12, a lighting equipment 60 of this embodiment has a pair of positive and negative terminals 60a, 60b that together clamp the light emitting device 100 from the side. More specifically, the terminals 60a, 60b are so shaped to have spring sections 61a, 61b and positioning sections 64a, 64b extending from base sections 65a, 65b along the sides of the light emitting device and its adjacent sides, and terminal sections 63a, 63b continuously extending from the positioning sections 64a, 64b so as to be able to be connected to external electrode terminals. The terminal sections 63a, 63b capable of being connected to the external electrode terminals extend substantially vertically relative to the side of the light emitting device 100. Herein, a part of each of the terminals 60a, 60b is in the form of spring piece 61a, 61b that exert elastic force in such a direction to clamp the light emitting device 100 so that the light emitting device 100 is fitted between the terminals 60a, 60b. The positive terminal (e.g., 60a) contacts the positive power supply part 7 formed on a first side section of the light emitting device 100, while the negative terminal (e.g., 60b) contacts the negative power supply part 8 formed on a second side section of the light emitting device 100. These terminals 60a, 60b respectively have wide surfaces parallel to the side of the light emitting device 100 so as to increase contacting areas to the side of the light emitting device 100. The terminals 60a, 60b respectively have the terminal sections 63a, 63b capable of being connected to the external electrodes in the same manner as the first and second embodiments. These terminal sections respectively have wide surfaces extending vertically relative to the main side of the light emitting device 100.

(Terminals)

The terminals (20a and 20b, or 60a and 60b) made of a conductive material are adapted to contact the power supply parts formed on the side and main side of the light emitting device for power supply thereto, and act as claming members to tightly support the light emitting device. Also, these terminals are comprised a pair of positive and negative terminals, which respectively have at least the first terminal sections in the form of the spring pieces that exert the elastic forces allowing themselves to clamp the light emitting device from the side thereof and the second terminal sections that support the light emitting device from the first main side. Alternatively, the positive and negative terminals are in the form of the first terminal sections having the spring pieces that exert elastic force in such a direction as to clamp the light emitting device only from the side of the light emitting device. The light emitting device thus supported from the main side and/or the side thereof can be tightly fixed in position and therefore prevented from being moved or rolled due to mechanical vibrations from the outside. Herein, it is possible to employ an arrangement where not only the first terminal sections but also the second terminal sections exert elastic force, thereby allowing the light emitting device to be clamped from its main sides by the second terminal sections and the heat transfer unit on which the light emitting device is mounted. With this arrangement, the light emitting device can be more tightly fixed in position and hence prevented from being moved or rolled due to vibrations from the outside.

The terminals of this embodiment are provided on one side with the terminal sections for mounting the light emitting device and on the opposite side with the terminal sections for connection with the external electrodes. The terminal sections for connection with the external electrodes are of a shape different from the shape of the terminal sections on the one side, so as to match in shape to the external electrodes. The terminals of this embodiment also have sections that are together able to position the light emitting device with respect to the direction in which the light emitting device is mounted. For example, the positive and negative terminals respectively have the positioning sections 24a, 24b, 64a, 64b, that extend along the side of the light emitting device so as to block the light emitting device from being further moved through the terminals in the mounting direction, thus securely fixing and supporting the light emitting device in position. The terminals can have these sections by the punching process and the bending process subjected to a metal plate.

The material and size of the terminals may be varied in light of the heat release capability, electric conductivity and elasticity. The terminals are preferably made solely of copper. In addition, a plate of copper or phosphorus-bronze copper, to which metal such as silver, palladium or gold is plated, is preferably used as a material of the terminals. This metal plating is preferable since it achieves high reflectance of light from the light emitting device 100 and improved light-extraction efficiency of the lighting equipment.

(Heat Transfer Unit)

The heat transfer unit 31 of the above embodiments is to allow the light emitting device to be mounted thereon and release heat generated in the light emitting device through the rear side of the device in the heat release direction. The heat transfer unit may be in the form of a copper, aluminium or other metal plate, or a heat pipe. Particularly, in the above embodiments, when a heat pipe is used as the heat transfer unit, a metal pipe made of metallic material such as copper or aluminium is filled with water, CFC, CFCs substitute, Florinate or other operational liquid for heat transfer is used, in which the operational liquid is heated at a heat input section (a hot section) and then turned to vapor, and the vapor is transferred to a heat release section (a low-temperature section) and liquefied to release the heat. This liquefied operational liquid is returned to the heat input section by the effect of capillary phenomenon. These operations are repeated so that it is achieved a remarkably high heat transfer capability by this heat pipe as the heat transfer unit.

Figure 13:
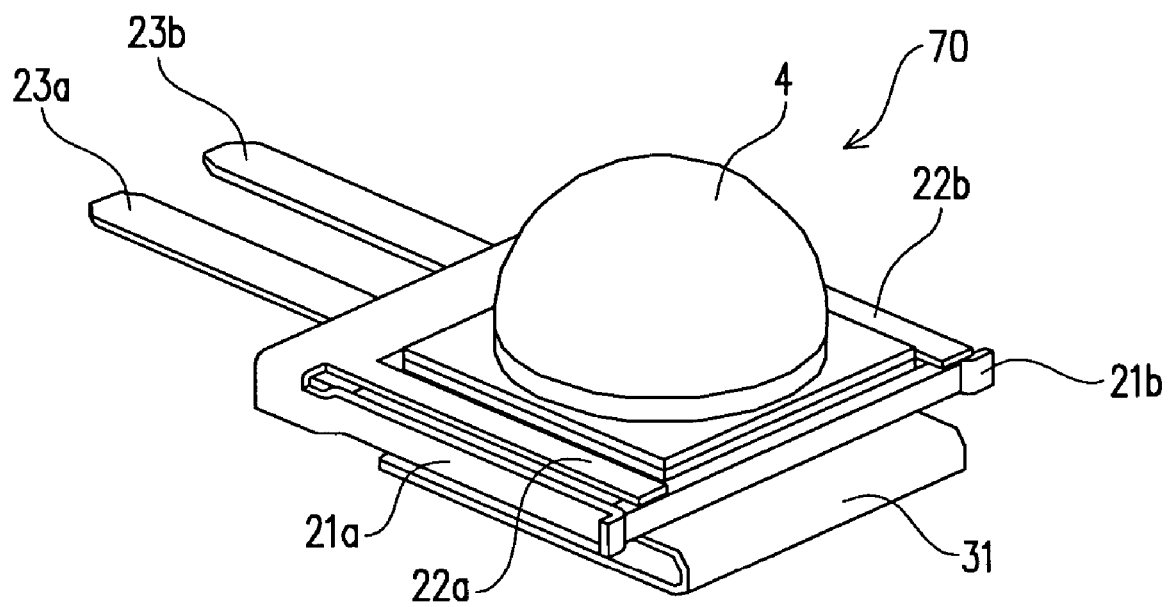
FIG. 13 is a perspective model view of a lighting equipment 70 according to another embodiment of the present invention.

In the above embodiments, the shape and size of the heat transfer unit may be varied in light of the direction in which heat is released, heat release effect and the like. For example, as illustrated in FIG. 9, the plate-like heat transfer unit 31, which extends from a position facing the rear side of the light emitting device 100 toward the terminal sections 23a, 23b for connection with the external electrode terminals, is bent at a right angle toward the heat release side. Alternatively, as in a lighting equipment 70 of FIG. 13, the heat transfer unit may be bent in U-shape on the side facing the rear side of the light emitting device 100.

(Reflection Unit)

In the lighting equipment of the above embodiments, a reflection unit having a surface that can be used as a reflection surface is located opposite to a light-emission observation side of the light emitting device so as to reflect light emitted from the light emitting device on the reflection surface in a given direction. The reflection surface of the reflection unit is preferably formed into a concave shape and is made of aluminium or plated with metal such as silver. The silver plating makes it possible to improve the reflectance of light. This reflection unit also acts to release heat, which is released from the light emitting device through the heat transfer unit, from the rear side of the lighting equipment to the outside.

The material, size and shape of the reflection unit may be varied in light of the heat release capability, the reflectance on the reflection surface, the size and optical output of the light emitting device, and the like. That is, it is possible to enlarge the reflection unit as the optical output of the light emitting device is increased. The reflection unit, to which an end of the heat transfer unit is connected, preferably has a good heat transfer capability in order to efficiently release heat of the light emitting diode to the outside. The thermal conductivity of the reflection unit is preferably 0.01 cal/(s)(cm$^2$)($°$ C./cm) or higher, and more preferably 0.5 cal/(s)(cm$^2$)($°$ C./cm) or higher.

The reflection unit is preferably made solely of aluminium. In addition, a plate of copper, aluminium or phosphorus-bronze copper, to which metal such as silver, palladium or gold is plated or solder plated, is preferably used as a material of the reflection unit. Silver plating is preferable since it achieves high reflectance of light from the light emitting device and improved light-extraction efficiency of the lighting equipment.

The lighting equipment of the present invention as described above has an excellent heat release capability and therefore emits high-brightness light. Also, it is highly stable against mechanical vibrations and therefore provides reliability.

For the above reasons, the lighting equipment of the present invention is not only applicable to a general lighting purpose but also to an automobile lighting equipment such as head light.

Although the above description was made for various embodiments of the present invention in some detail, it will be appreciated that the currently disclosed contents of these embodiments will be changed or modified. Accordingly, the combination, order, modification or the like of the respective elements can be achieved without departing from the spirit and scope of the present invention as defined in the appended claims.

Figure 14:
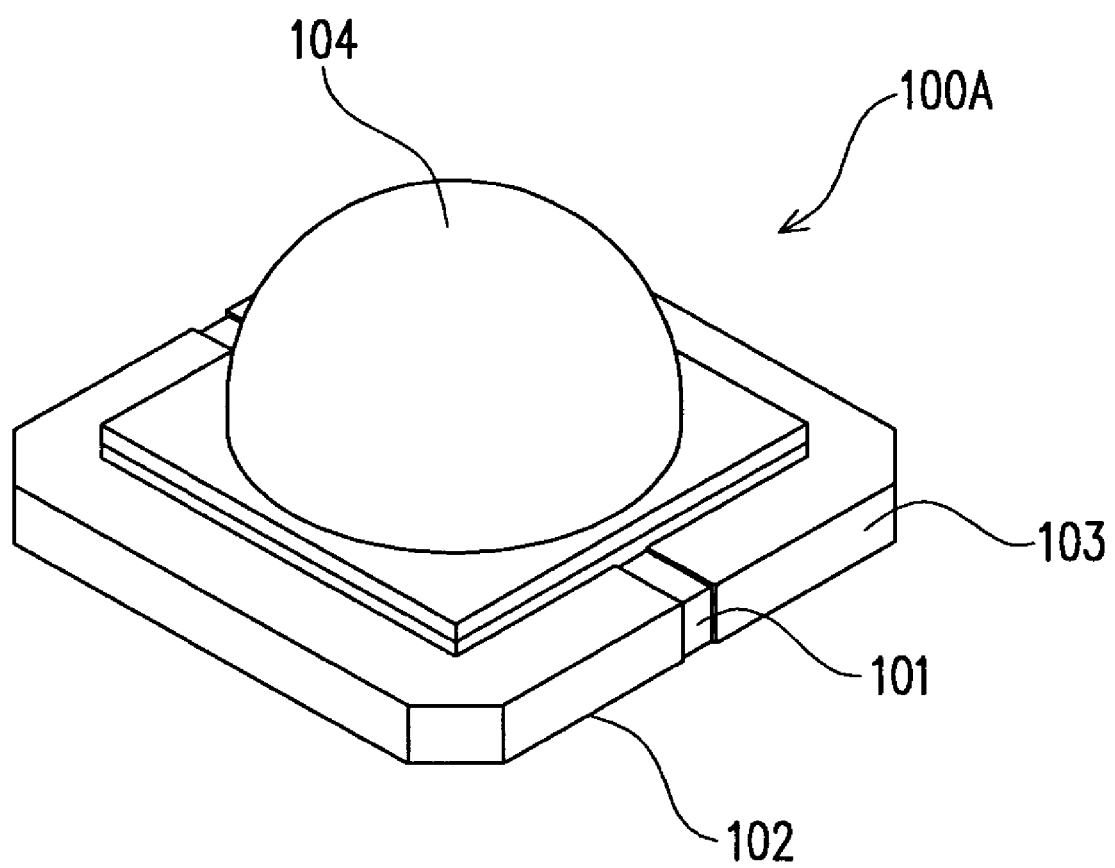
FIG. 14 is a perspective model view of a light emitting device 100A to be used in the lighting equipment of any one of the aforesaid embodiments.

For example, in the above embodiments (FIGS. 9, 10, 12 and 13), the light emitting device of the present invention (the light emitting device 100) is used. However, this is not essential. A light emitting device 100A as illustrated in FIG. 14, or the like may be used. The light emitting device 100A of FIG. 14 has a pair of positive and negative conductive patterns (a positive electrode 102 and a negative electrode 103) provided on a main side of a substrate with an insulation separation section 101 therebetween for insulation separation of the electrodes, and an light emitting element fixed on the main side of the substrate, in which electrodes of the light emitting element are electrically connected to the conductive patterns. This electrical connection between the light emitting element and the conductive pattern is made by a conductive wire made of Au. Alternatively, a pair of positive and negative electrodes provided on the same side of the light emitting element may be positioned facing to the conductive patterns and directly bonded thereto via a conductive material. The conductive patterns extend from a light-emission observation side, that is, a first main-side of the substrate to the side of the substrate so as to have the conductive material forming positive and negative sections insulated and separated from each other. A light transmitting part 104 is made of a hard silicone resin and formed into a hollowed hemisphere. By the main side is herein meant a light-emission observation side or a mounting side of the light emitting device for the light emitting device and particularly the substrate, and a side having a wide area for the plate-like terminals.

More specifically, in the light emitting device 100A, the light emitting element is mounted on an insulation substrate with the conductive patters formed thereon with the conductive material, directly or indirectly via a thermal conductive substrate as the submount. Herein, as the conductive material, gold, silver, copper or the like is used and is plated on the insulation substrate, thus forming the conductive patterns. As the insulation substrate, a glass epoxy resin substrate is mainly used. Also, it is possible to form a substrate of the light emitting device 100A with positive and negative plates of metal facing each other and bonded to each other with an insulation resin for insulation separation of the plates.

As the light emitting element, an LED chip is used. Plural LED chips may be used according to the optical output of the light emitting device 100A. Also, the size and shape of each LED chip, or the alignment pattern of plural LED chips may be varied to produce desired optical characteristics.

While it is not necessary to limit an LED chip to a specific type, but where a fluorescent material is used, a semiconductor light emitting element having an active layer that is capable of emitting light of a wavelength that can excite fluorescent material is preferably used. As such a semiconductor light emitting element, various semiconductors of ZnSe, GaN or the like can be cited. Among of them, a nitride semiconductor ($In_X AlYGa_{1-X-Y}N$, $0 \leq X$, $0 \leq Y$, $X+Y \leq 1$) that can emit light of a short wavelength that can efficiently excite a fluorescent material is preferable. The nitride semiconductor may contain boron, phosphorus or the like according to needs. As the structure of the semiconductor, it can be cited a homo structure, hetero structure or double-hetero structure provided with a MIS junction, PIN junction, pn junction or the like. The emission wavelength may be varied depending on the material of a semiconductor layer, its mixed crystal composition ratio or the like. The active layer may be of a single-quantum-well structure, multi-quantum-well structure or the like formed into a thin film that produces quantum effects.

Where the nitride semiconductor is used, sapphire, spinel, SiC, Si, ZnO, GaN or the like can be used for the substrate, but it is preferable to use a sapphire substrate in order to form the nitride semiconductor of good crystallinity satisfactorily in mass production. The nitride semiconductor can be formed on the sapphire substrate by MOCVD process or the like. It is preferable to form a buffer layer such as GaN, AlN or GaAlN on the sapphire substrate and form the nitride semiconductor layer having pn junction thereon. It is possible to remove the substrate after building up the semiconductor layers.

The light emitting element having pn junction using the nitride semiconductor may be of a double heterojunction structure with a first contact layer of n-type gallium nitride formed on the buffer layer, a first cladding layer of n-type aluminum gallium nitride, an active layer of indium gallium nitride, a second cladding layer of p-type aluminum gallium nitride and a second contact layer of p-type gallium nitride, those being successively built up in the order. The nitride semiconductor shows n-type conductivity when not doped with an impurity. Where a desired n-type nitride semiconductor capable of such as achieving improved light-emitting efficiency is to be formed, it is preferable to introduce as an n-type dopant Si, Ge, Se, Te, C or the like. On the other hand, where a p-type nitride semiconductor is to be formed, Zn, Mg, Be, Ca, Sr, Ba or the like is preferably added as a p-type dopant. Since the nitride semiconductor is hard to turn into p-type simply by doping with a p-type dopant, it is preferable to decrease resistance by heating in a furnace, by plasma irradiation or the like after introducing the p-type dopant. Thus the light emitting element made up of the nitride semiconductor can be manufactured by forming the electrodes and then cutting a wafer into individual chips. The patterning process may be applied so as to form an insulation protective film made of such as $SiO_2$ on the entire element, while exposing only the bonding portion of each electrode. This contributes to manufacturing of a small-size light emitting device with high reliability.

In order to have the light emitting device 100A emit white mixed-color light, it is preferable to set the wavelength of light emitted by the light emitting element within a range from 400 nm to 530 nm in consideration of the relationship of complementary color with the emission wavelength from the fluorescent material and a possible deterioration of the light transmitting resin, and the wavelength is more preferably set within a range from 420 nm to 490 nm. In order to improve the excitation efficiency between the light emitting element and the fluorescent material and light emission efficiency of the light emitting element, it is more preferable to set the wavelength of light within a range from 450 nm to 475 nm. It is also possible to employ a light emitting element with a main emission wavelength in ultraviolet region of a wavelength shorter than 400 nm or in short wavelength region of visible light, in combination with a material that is relatively hard to be deteriorated by ultraviolet rays.

Figure 15:
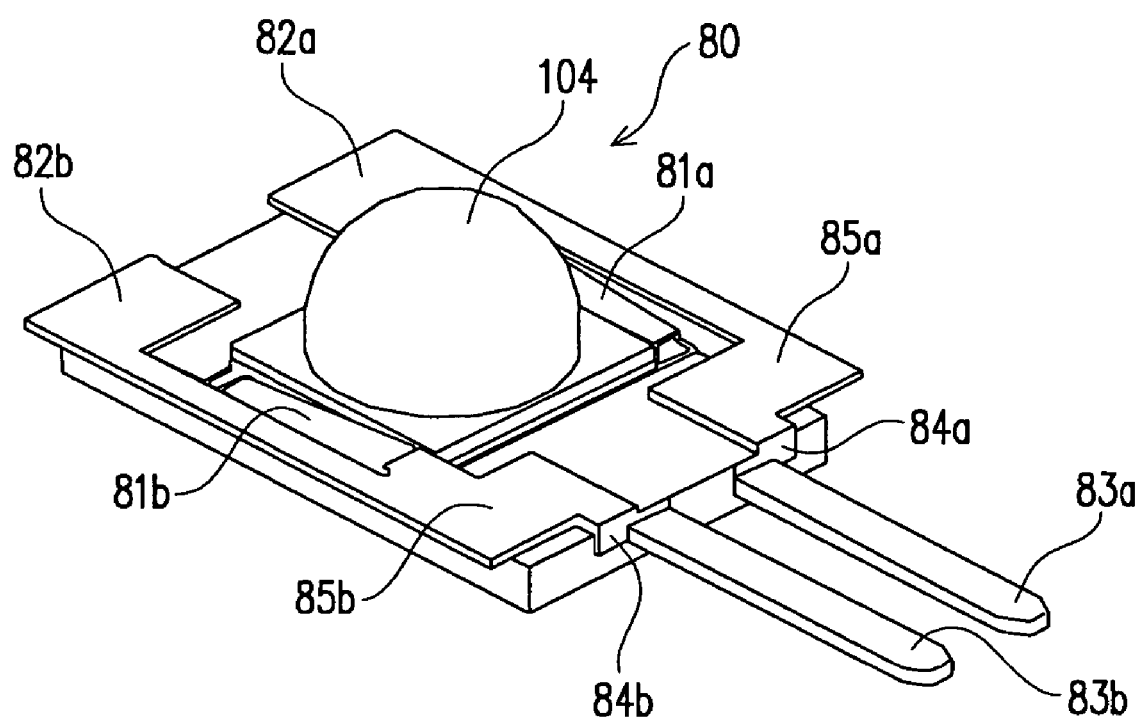
FIG. 15 is a perspective model view of a lighting equipment 80 using the light emitting device 100A of FIG. 14.

The light emitting device 100A as described above can be used in the respective lighting equipments of the above embodiments. In addition, as another embodiment of the lighting equipment, the light emitting device 100A can be used in a lighting equipment 80 as illustrated in FIG. 15. The lighting equipment 80 has the light emitting device 100A supported from the main side and has a pair of positive and negative terminals for power supply to the light emitting device 100A. More specifically, the substrate of the light emitting device 100A has the opposite main sides respectively supported by the both positive and negative terminals and the mounting side of a part (e.g., the heat transfer unit) on which the light emitting device is mounted. The positive and negative terminals respectively have base sections 85a, 85b and support sections 82a, 82b respectively extending from the base sections 85a, 85b along the main side of the light emitting device, and positioning sections 84a, 84b along the side of the substrate of the light emitting device 100A. Extensions continuously formed from the positioning sections 84a, 84b form terminal sections 83a, 83b for connection with the external electrodes. The terminal sections 83a, 83b for connection with the external terminals extend substantially vertically relative to the side of the substrate of the light emitting device 100A. Herein, the positive and negative terminals are formed into spring-like shape to exert elastic force in such a direction as to clamp the substrate of the light emitting device 100A. With this arrangement, the light transmitting part 104 of the light emitting device 100A is fitted between the both terminals. For example, the positive and negative terminals each are made of a metal plate and respectively have spring strips 81a, 81b each formed by bending a part of the metal plate toward the main side of the substrate of the light emitting device 100A. The spring strips 81a, 81b have proximal ends located opposite to each other and extend therefrom in the opposite directions. The spring strip 81a provided for the positive terminal contacts the positive electrode 102 provided on the main side of the substrate of the light emitting device 100A, while the spring strip 81b provided for the negative terminal contacts the negative electrode 103 provided on the same main side of the substrate of the light emitting device 100A. The terminals respectively have wide surfaces oriented parallel to the main side of the substrate so as to have increased contacting areas with the substrate of the light emitting device 100A. Also, the terminals respectively have the terminal sections 83a, 83b for connection with the external electrodes in the same manner as the above embodiments. These terminal sections respectively have wide surfaces oriented parallel to the main side of the substrate of the light emitting device 100A.

The light emitting device 100A is preferably mounted on the heat transfer unit via a thermal conductive substrate. The thermal conductive substrate acts to transfer heat generated from the light emitting device 100A to the heat transfer unit. The thermal conductive substrate may be varied in size in light of the heat release capability, the optical output of a light source and the like. The light emitting device 100A is connected to the heat transfer unit via the thermal conductive substrate. Accordingly, the thermal conductive substrate preferably has a good heat transfer capability in order to efficiently release heat radiated from the light emitting device 100A toward the heat transfer unit. Specifically, the thermal conductivity of the thermal conductive substrate is preferably 0.01 cal/(s)(cm$^2$)(° C./cm) or higher, and more preferably 0.5 cal/(s)(cm$^2$)(° C./cm) or higher.

The thermal conductive substrate is preferably formed solely of a plate of ceramics, copper, aluminium, phosphorus-bronze or the like. In addition, a plate of these materials, to which metal such as silver, palladium, or gold is plated or solder plated, is preferably used as a material of the thermal conductive substrate.

This specification is by no means intended to restrict the present invention to the preferred embodiments set forth therein. Various modifications to the light emitting device, method of manufacturing the same and the lighting equipment, as described herein, may be made by those skilled in the art without departing from the spirit and scope of the present invention as defined in the appended claims.

What is claimed is:

1. A light emitting device comprising a heat-release metallic part made of metal and a packaging ceramic part made of ceramics bonded to the metallic part via an adhesive, wherein the adhesive is a hot melt that melts with heat at a melting temperature higher than a given temperature and has flexibility when it has been hardened and formed a bond, the light emitting device further comprising a light transmitting part for transmitting therethrough light emitted from a light source, wherein said light transmitting part has a peripheral edge bonded to the ceramic part by the hot melt.

2. The light emitting device according to claim 1, wherein said light emitting device is provided in the form of a light emitting diode with a light emitting element provided on any one of the metallic part and the ceramic part.

3. The light emitting device according to claim 2, wherein said light transmitting part is a glass lens of a dome shape with a hollowed hemisphere and is designed to substantially radially direct light passing therethrough. which light being emitted from a light source located at substantially the center of the dome-shaped light transmitting part.

4. The light emitting device according to claim 3, wherein the hot melt is comprised of a first hot melt for bonding between the metallic part and the ceramic part, and a second hot melt for bonding between the light transmitting part and the ceramic part with the relationship between a melting temperature a of the first hot melt and a melting temperature b of the second hot melt: a>b.

5. The light emitting device according to claim 2, wherein the light emitting element is located 0.5 mm–2 mm away from the top surface of a peripheral edge of any one of the metallic part and the ceramic part.

6. The light emitting device according to claim 2, wherein the light emitting element is mounted on any one of the metallic part and the ceramic part via an element mounting part for mounting the light emitting element thereon.

7. The light emitting device according to claim 6, wherein the element mounting part is formed into a tapered shape, allowing itself to be gradually smaller to a light emitting element mounting side.

8. The light emitting device according to claim 6, wherein the light emitting element mounting part has a surface sized or dimensioned so that, with the light emitting element mounted on said surface, the mounting part has a peripheral surface area extending 0.1 mm–0.5 mm from a peripheral edge of the light emitting element.

9. The light emitting device according to claim 2, wherein the light emitting element is of cubic shape having a square or rectangular light-emitting surface of $1 \text{ mm}^1$–9 mm.

10. The light emitting device according to claim 9, wherein any one of the metallic part and the ceramic part has a mounting side of about $81 \text{ mm}^2$–$144 \text{ mm}^2$ and any one of a square shape and a rectangular shape that contains the shape of the light emitting surface of the light emitting element, in which the light emitting element is mounted to the mounting side of any one of the metallic part and the ceramic part.

11. A lighting equipment comprising the light emitting device according to claim 1 and at least a pair of positive and negative terminals for power supply to the light emitting device, wherein each of said at least a pair of positive and negative terminals is designed to clamp the light emitting device.

12. The lighting equipment according to claim 11, further comprising a heat transfer unit that supports the light emitting device from a bottom side thereof.

13. The lighting equipment according to claim 11, wherein the light emitting device has a light-emission observation side and a light reflection surface located opposite thereto.

14. The lighting equipment according to claim 13, wherein the light reflection surface is made of a metallic material.

15. The lighting equipment according to claim 13, wherein the light reflection surface releases heat transmitted by the heat transfer unit.

16. A light emitting device comprising a heat-release metallic part made of metal, a packaging ceramic part made of ceramics and a light transmitting part for transmitting therethrough light emitted from a light source, wherein
the metallic part, the ceramic part and the light transmitting part are bonded to each other in this order via an adhesive,
the adhesive is a hot melt designed to melt with heat at a melting temperature higher than a given temperature and has flexibility when it has been hardened and formed a bond, and
the hot melt is comprised of a first hot melt for bonding between the metallic part and the ceramic part, and a second hot melt for bonding between the light transmitting part and the ceramic part, wherein the melting temperature of the first hot melt is greater than the melting temperature of the second hot melt.

17. A light emitting device comprising a packaging ceramic part made of ceramics and a light transmitting part having light-transmitting characteristics bonded to the ceramic part, wherein
the light transmitting part has a peripheral edge bonded to the ceramic part by an adhesive,
a light emitting element is provided to any one of a heat-release metallic part and the ceramic part via an element mounting part, and
the peripheral edge of the light transmitting part has a top surface lower than a top surface of the element mounting part.

18. The light emitting device according to claim 17, wherein said light emitting device is provided in the form of a light emitting diode with a light emitting element provided on the ceramic part.

19. The light emitting device according to claim 18, wherein said light transmitting part is a glass lens of a dome shape with a hollowed hemisphere and is designed to substantially radially direct light passing therethrough, which light being emitted from a light source located at substantially the center of the dome-shaped light transmitting part.

20. The light emitting device according to claim 18, wherein said light emitting element is located about 0.5 mm–2 mm away from the top surface of the peripheral edge of the metallic part.

21. The light emitting device according to claim 17, wherein the element mounting part is tapered towards a side thereof on which the light emitting element is mounted.

22. The light emitting device according to claim 17, wherein the element mounting part has a mounting side that is larger than the light emitting element so that, with the light emitting element mounted on the mounting side, the element mounting part has a peripheral surface area extending about 0.1 mm–0.5 mm from a peripheral edge of the light emitting element.

23. The light emitting device according to claim 18, wherein the light emitting element is of cubic shape having a square or rectangular light emitting surface of $1 \text{ mm}^2$–$9 \text{ mm}^2$.

24. The light emitting device according to claim 23, wherein the ceramic part has a mounting side of about $81 \text{ mm}^2$–$144 \text{ mm}^2$ and any one of a square shape and a rectangular shape which contains the shape of the light emitting surface of the light emitting element, and the light emitting element is mounted to the mounting side of the metallic part.

25. A lighting equipment comprising the light emitting device according to claim 17 and at least a pair of positive and negative terminals for power supply to the light emitting device, wherein each of said at least a pair of positive and negative terminals is designed to clamp the light emitting device.

26. The lighting equipment according to claim 25, wherein said at least a pair of positive and negative terminals comprise a first pair of terminal sections for supporting the light emitting device from a lateral side of the same and a second pair of terminal sections for supporting the light emitting device from an upper side of the same, and said first pair of terminal sections are designed to clamp the light emitting device.

27. The lighting equipment according to claim 25, further comprising a heat transfer unit that supports the light emitting device from a bottom side thereof.

28. The lighting equipment according to claim 25, wherein the light emitting device has a light emission observation side and a light reflection surface located opposite thereto.

29. The lighting equipment according to claim 28, wherein the light reflection surface is made of a metallic material.

30. The lighting equipment according to claim 28, wherein the light reflection surface releases heat transmitted by a heat transfer unit.

31. The light emitting device according to claim 1, wherein the ceramic part has pores at least in a given bonding surface region so that the hot melt is impregnated into the pores.

32. The lighting equipment according to claim 11, wherein said at least a pair of positive and negative terminals comprise a first pair of terminal sections for supporting the light emitting device from a lateral side of the same and a second pair of terminal sections for supporting the light emitting device from an upper side of the same, and said first pair of terminal sections are designed to clamp the light emitting device.

* * * * *